(12) United States Patent
Kataoka et al.

(10) Patent No.: US 10,311,034 B2
(45) Date of Patent: Jun. 4, 2019

(54) COMPUTER-READABLE RECORDING MEDIUM

(71) Applicant: FUJITSU LIMITED, Kawasaki-shi, Kanagawa (JP)

(72) Inventors: Masahiro Kataoka, Kamakura (JP); Takafumi Ohta, Shinagawa (JP); Masao Ideuchi, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 290 days.

(21) Appl. No.: 14/962,398

(22) Filed: Dec. 8, 2015

(65) Prior Publication Data
US 2016/0171031 A1 Jun. 16, 2016

(30) Foreign Application Priority Data
Dec. 10, 2014 (JP) .................. 2014-250289

(51) Int. Cl.
*G06F 16/22* (2019.01)
*G06F 16/242* (2019.01)
(Continued)

(52) U.S. Cl.
CPC ........ *G06F 16/2272* (2019.01); *G06F 16/243* (2019.01); *G06F 16/313* (2019.01); *G06F 16/3334* (2019.01); *H03M 7/3088* (2013.01)

(58) Field of Classification Search
CPC ......... G06F 17/30616; G06F 17/30401; G06F 17/30663; G06F 17/30336; G06F 16/2272;
(Continued)

(56) References Cited

U.S. PATENT DOCUMENTS

| 5,590,317 A | 12/1996 | Iguchi et al. |
| 5,745,745 A | 4/1998 | Tada et al. |

(Continued)

FOREIGN PATENT DOCUMENTS

| EP | 0 788 239 A2 | 8/1997 |
| EP | 0 788 239 A3 | 8/1997 |

(Continued)

OTHER PUBLICATIONS

Extended European Search Report dated May 9, 2016 in Patent Application No. 15198431.7.

(Continued)

*Primary Examiner* — Phong H Nguyen
(74) *Attorney, Agent, or Firm* — Xsensus LLP

(57) ABSTRACT

A storing unit stores appearance information of the extracted word in correspondence with a specific record of the specific word in an index data when a specific word extracted from a target file is stored in a static dictionary that stores a plurality of words and a plurality of compressed codes corresponding respectively to the plurality of words, the appearance information including, existence information indicating whether the specific word exists in the target file or the appearance information indicating how many times the specific word has appeared in the target file. The storing unit stores adds a specific record of the specific word to the index data and stores the appearance information when the specific extracted word is not stored in the static dictionary and stored in a dynamic dictionary whose records are added in a course of compression.

8 Claims, 18 Drawing Sheets

(51) Int. Cl.
  *H03M 7/30* (2006.01)
  *G06F 16/33* (2019.01)
  *G06F 16/31* (2019.01)

(58) Field of Classification Search
  CPC .. G06F 16/243; G06F 16/313; G06F 16/3334; H03M 7/3088
  USPC ........................................................ 707/741
  See application file for complete search history.

(56) References Cited

U.S. PATENT DOCUMENTS

| | | | | |
|---|---|---|---|---|
| 5,872,530 | A * | 2/1999 | Domyo | H03M 7/3088 341/106 |
| 6,128,412 | A * | 10/2000 | Satoh | H03M 7/40 382/228 |
| 6,542,644 | B1 * | 4/2003 | Satoh | H03M 7/40 375/240.23 |
| 8,046,487 | B2 * | 10/2011 | Jagannathan | H04L 69/167 709/218 |
| 2005/0198027 | A1 * | 9/2005 | Hamaguchi | G06F 16/313 707/999.005 |
| 2006/0106940 | A1 * | 5/2006 | Jagannathan | H04L 69/16 709/238 |
| 2008/0250007 | A1 | 10/2008 | Masuyama et al. | |
| 2013/0318124 | A1 * | 11/2013 | Ohta | G06F 16/3347 707/780 |
| 2014/0156663 | A1 * | 6/2014 | Rhyu | G11B 27/031 707/737 |

FOREIGN PATENT DOCUMENTS

| | | |
|---|---|---|
| EP | 1 677 210 A1 | 7/2006 |
| JP | 5-241776 | 9/1993 |
| JP | 5-324427 | 12/1993 |
| JP | 8-147311 | 6/1996 |
| JP | 9-214352 | 8/1997 |
| JP | 2004-110271 | 4/2004 |

OTHER PUBLICATIONS

Japanese Office Action dated May 29, 2018 in Patent Application No. 2014-250289 (with English translation), citing document AO therein, 9 pages.

Office Action dated Oct. 23, 2018 in Japanese Patent Application No. 2014-250289, citing document AO therein, with English-language translation, 8 pages.

* cited by examiner

FIG.2A
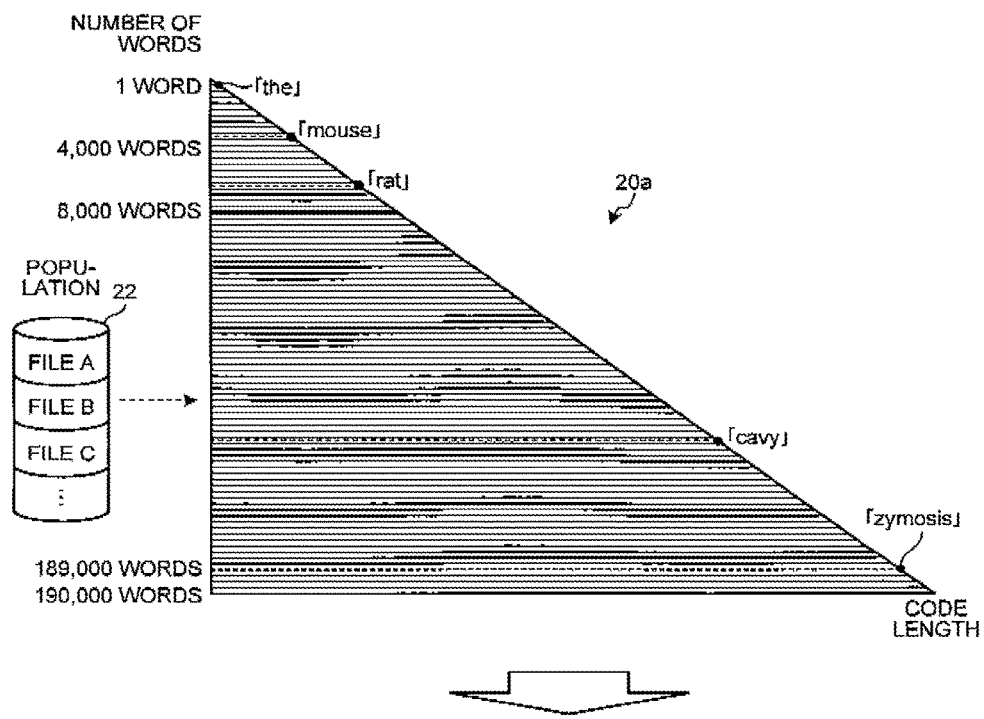
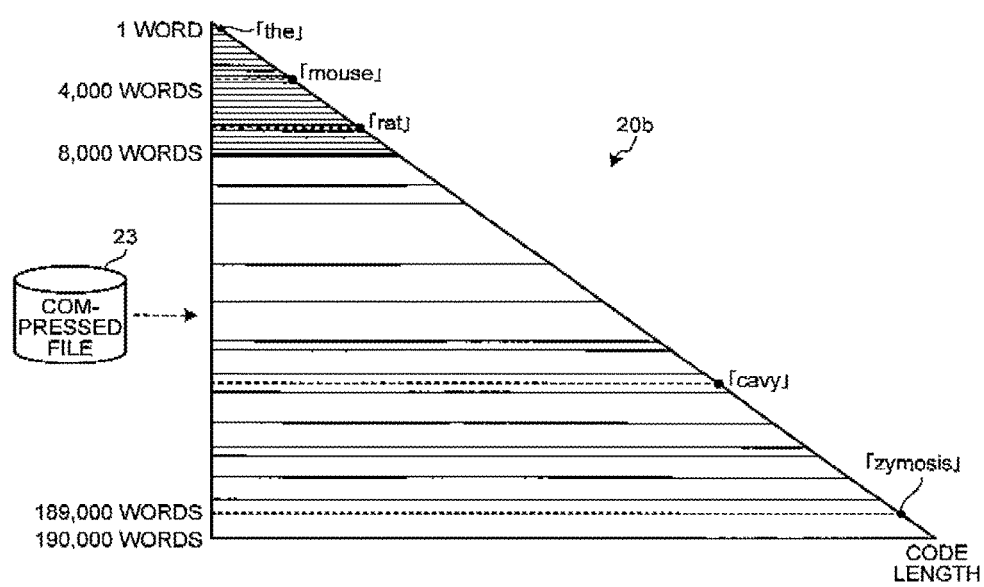

FIG.12

| SYNONYM NUMBERS | SYNONYMS |
|---|---|
| F00011h | mouse, rat, cavy, ⋯ |
| ⋮ | ⋮ |

FIG.14

COUNT MAP INDEX 125

| | REGISTRATION NUMBERS | | FILE NUMBERS 1 | 2 | 3 | ... n | |
|---|---|---|---|---|---|---|---|
| STATIC NUMBERS | 0005h | able | 1100 | 0001 | 0000··· | | 125a |
| | 0012h | about | 0001 | 0010 | 0101··· | | |
| | 0123h | first | 0000 | 0011 | 0001··· | | |
| | 181Ah | was | 0000 | 0000 | 0001··· | | |
| DYNAMIC NUMBER | REGISTRATION NUMBERS | | | | | | |
| | 2004h | cavy | 0000 | 0000 | 0011··· | | 125b |
| | SYNONYM NUMBERS | | | | | | |
| | F00011h | | 0011 | 0001 | 0010··· | | 125c |

COMPUTER-READABLE RECORDING MEDIUM

CROSS-REFERENCE TO RELATED APPLICATION

This application is based upon and claims the benefit of priority of the prior Japanese Patent Application No. 2014-250289, filed on Dec. 10, 2014, the entire contents of which are incorporated herein by reference.

FIELD

The embodiments discussed herein are related to a compression computer program (hereinafter, "compression program") and a search computer program (hereinafter, "search program").

BACKGROUND

A technique is known by which a search is conducted for a file having a high degree of relevance to a character string serving as a search target (hereinafter, a "search-target character string"). According to this technique, one or more files each containing the words in the search-target character string are identified by using an index, so that a degree of relevance to the search-target character string is calculated for each of the identified files. The index denotes an information bit string indicating the files containing the words. Further, a list of candidates is displayed in a ranking format, by listing up the files in descending order of the degrees of relevance to the search-target character string.

Patent Document 1: Japanese Laid-open Patent Publication No. 2004-110271
Patent Document 2: Japanese Laid-open Patent Publication No. 08-147311
Patent Document 3: Japanese Laid-open Patent Publication No. 09-214352
Patent Document 4: Japanese Laid-open Patent Publication No. 05-241776

Examples of indexes that can be used in the search include an index in an N-gram format. In the index in the N-gram format, information is recorded to indicate, for each of N-gram sequences containing as many as N characters in a sequence, whether the N-gram sequence is contained in a file. A 1-gram of which the value of N is 1 may also be referred to as a uni-gram. A 2-gram of which the value of N is 2 may also be referred to as a bi-gram. A 3-gram of which the value of N is 3 may also be referred to as a tri-gram.

For example, when an index in a 1-gram format is prepared for Japanese text, although it is possible to keep the data size of the index small, large search noise may occur. For example, let us assume that the index in the 1-gram format records therein information indicating whether each of the 8,000 characters that are used with higher frequency is contained in a file or not. The index in the 1-gram format is configured to record therein only the information indicating whether each of the 8,000 characters is contained in the file or not. It is therefore possible to keep the data size of the index small. However, because the index in the 1-gram format records therein the information indicating, for each of the characters, whether the character is contained in the file, large search noise may occur. For example, when an index in the 1-gram format is generated with respect to a file recording therein "kyou-to-no-tou-bu (lit. Eastern Part of Kyoto)" (the example sentence is divided by "-" every character of Japanese), the index stores therein information indicating that the characters "kyou" "to" no "tou" "bu" are contained. When this index is used for conducting a search as to, for example, whether the word "tou-kyou (lit. Tokyo)" is contained or not, because the index has recorded therein that the character "tou" and the character "kyou" are contained, the search will erroneously find that the word "tou-kyou" is contained.

Incidentally, as for indexes in the N-gram format, the larger the value of N is, the smaller search noise will be. However, the larger the value of N is, the more significantly the data size of the index increases. For example, an index in a 2-gram format records therein information indicating, for each of 2-gram sequences obtained by combining the 8,000 characters used with higher frequency, whether the 2-gram sequence is contained in a file or not. For example, when an index in the 2-gram format is generated with respect to a file storing therein "kyou-to-no-tou-bu", the index records therein information indicating that the two-character sequences "kyou-to", "to-no", "no-tou", and "tou-bu" are contained. When this index is used for conducting a search as to, for example, whether the word "toukyou" is contained or not, because the index does not record therein that the two-character sequence "tou-kyou" is contained, the search will not find that the file contains the word "tou-kyou". However, the index in the 2-gram format records therein the information indicating, for each of the combinations of 2-gram sequences of which the quantity is 8,000 times 8,000, whether the 2-gram sequence is contained in the file. Thus, compared to the example in the 1-gram format, the data size of the index is increased significantly. As explained herein, with indexes in the N-gram format, there is a trade-off relationship between reduction of the search noise and reduction of the data size.

Further, with English text also, for example, with respect to a phrase "This is a ball", the 1-gram "a" is contained in the word "a" and the word "ball", whereas the 2-gram "is" is contained in the word "This" and the word "is". Accordingly, because large search noise may occur, an index of more than one gram is desirable. Thus, there is a trade-off relationship similar to the example with Japanese text.

To cope with this situation, another method is also possible by which, for example, a focus is placed on words with higher frequency so that an index records therein information indicating, for each of the higher frequency words having higher frequency of appearance, whether the word is contained in a file or not, and indicating, for each of the words other than the higher frequency words, whether each of the N-gram sequences structuring the words is contained in the file or not. However, search noise still may occur for the words other than the higher frequency words because the information is recorded to indicate whether each of the N-gram sequences structuring the words is present or not, unlike the higher frequency words for which the information is recorded to indicate whether each of the words is contained in the file or not.

SUMMARY

According to an aspect of an embodiment, a computer-readable recording medium stores therein a compression program that causes a computer to execute a process. The process includes extracting a specific word from a target file; storing appearance information of the extracted word in correspondence with a specific record of the specific word in an index data, when the specific word is stored in a static dictionary that stores a plurality of words and a plurality of compressed codes corresponding respectively to the plurality of words, the appearance information including existence information indicating whether the specific word exists in the target file or appearance information indicating how many times the specific word has appeared in the target file, the index data including the plurality of words in the static dictionary; and adding a specific record of the specific word to the index data and storing appearance information of the extracted word in correspondence with the specific record of the specific word in the index data, when the specific word is not stored in the static dictionary and stored in a dynamic dictionary whose records are added in a course of compression, the appearance information including existence information indicating whether the specific word exists in the target file or appearance information indicating how many times the specific word has appeared in the target file.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2A is a drawing for explaining frequency of appearance of each word;

FIG. 12 is a drawing of an exemplary data structure of a synonym database according to a second embodiment;

FIG. 14 is a drawing of an example of a count map index;

DESCRIPTION OF EMBODIMENTS

Preferred embodiments of the present invention will be explained with reference to accompanying drawings. The scope of the claims shall not be limited by these embodiments. It is possible to implement any of the embodiments in combination as appropriate, as long as no conflict arises in the contents of the processing.

[a] First Embodiment

Figure 1:
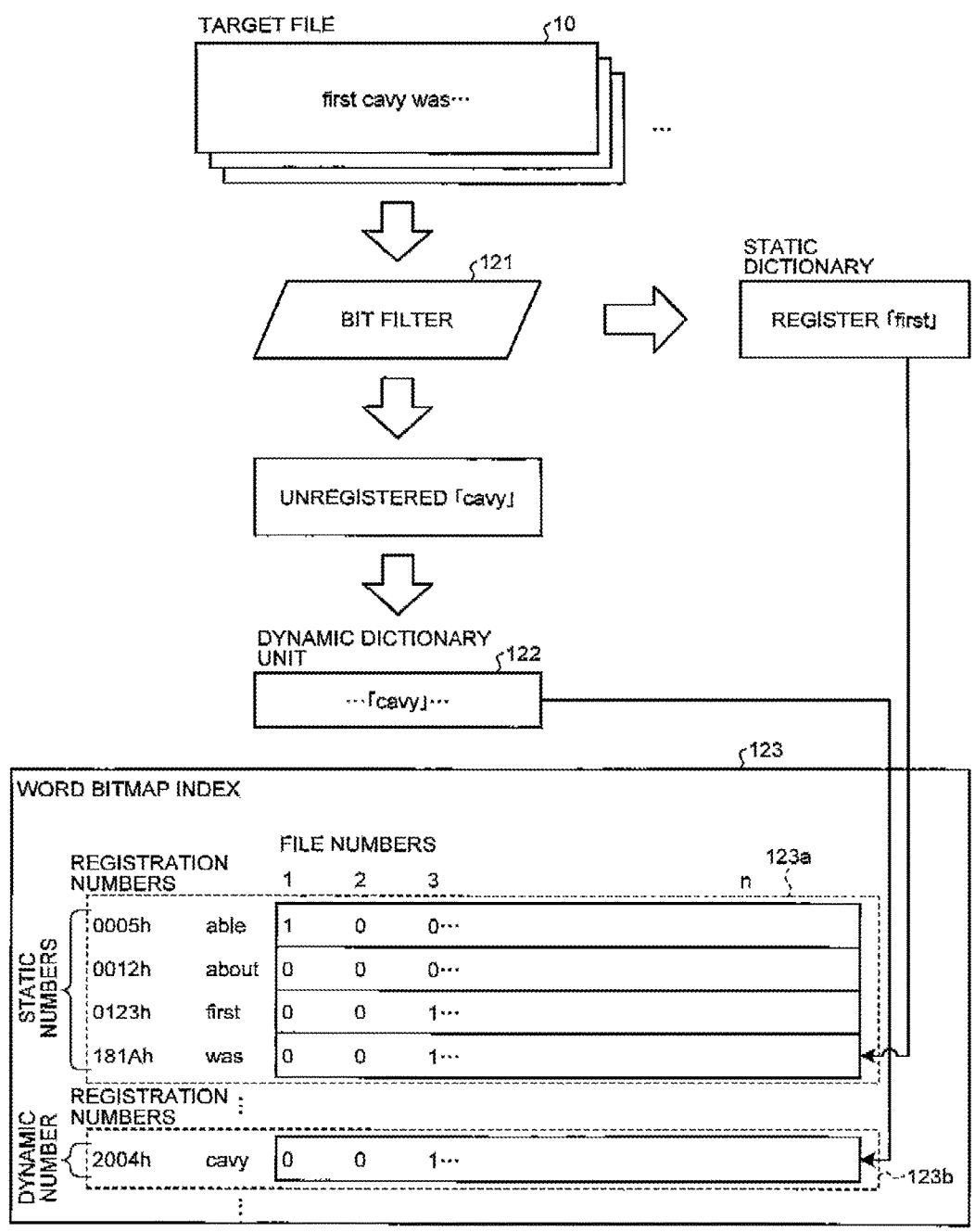
FIG. 1 is a drawing of a flow in a process of generating an index according to a first embodiment.

To begin with, a process of generating an index (index data) performed by an information processing apparatus 100 according to a first embodiment will be explained, with reference to FIG. 1. The information processing apparatus 100 performs a process of generating an index when compressing a file. FIG. 1 is a drawing of a flow in the process of generating the index according to the first embodiment. FIG. 1 illustrates an example in which an index is generated with respect to the sentence "first cavy was . . . " contained in a target file 10 to be compressed. The information processing apparatus 100 obtains the words from a document included in the target file 10, in units of words. In the example illustrated in FIG. 1, the information processing apparatus 100 obtains "first", "cavy", and "was". After that, the information processing apparatus 100 compares the obtained words with a bit filter 121.

The bit filter 121 is a compression-purpose dictionary that stores therein a compressed code for each word. A detailed configuration of the bit filter 121 will be explained later. In the bit filter 121, a compressed code and a registration number in the index are registered for each of higher frequency words having higher frequency of appearance, whereas a compressed code and a registration number in the index are unregistered in the initial state for each of lower frequency words having lower frequency of appearance. In the example illustrated in FIG. 1, "cavy" is a lower frequency word, whereas "first" and "was" are higher frequency words. The bit filter 121 has registered therein the compressed codes of the higher frequency words "first" and "was", but does not have registered therein any compressed code of the lower frequency word "cavy".

As a result of the comparing process, when a compressed code corresponding to any of the compared words is registered in the bit filter 121, the information processing apparatus 100 obtains the compressed code of the compared word from the bit filter 121 and outputs the obtained compressed code to a compressed file. On the contrary, as a result of the comparing process, when no compressed code corresponding to the compared word is registered in the bit filter 121, the information processing apparatus 100 assigns a new compressed code and registers the assigned compressed code into a dynamic dictionary unit 122. Further, the information processing apparatus 100 registers the new compressed code into the bit filter 121, as a compressed code corresponding to the compared word. After that, the information processing apparatus 100 outputs the new compressed code to the compressed file. In addition, the information processing apparatus 100 records information indicating that the compared word is contained in the target file 10, into a word bitmap index 123.

The word bitmap index 123 is an index storing therein information indicating, for each of the files, whether each of the words appears or not. The word bitmap index 123 is provided with a first storage region 123a that stores therein information indicating whether each of the higher frequency words appears in each of the files and a second storage region 123b that stores therein information indicating whether each of the lower frequency words appears in each of the files. The first storage region 123a is provided in advance for the purpose of storing therein information indicating whether each of the higher frequency words appears in the target file 10. In other words, in the first storage region 123a, a storage region corresponding only to the higher frequency words is reserved in advance. For instance, in the example illustrated in FIG. 1, the first storage region 123a is provided, in advance, with a storage region storing therein information indicating whether or not each of the higher frequency words appears in each of the files of which the quantity is n. In the second storage region 123b, when a lower frequency word appears in the target file 10, a storage region that stores therein information indicating whether the appearing lower frequency word appears in each of the files or not is additionally provided. In other words, in the second storage region 123b, a storage region is reserved every time a new lower frequency word appears in the target file 10.

The bit filter 121 has registered therein, in advance, a registration number of the higher frequency word "first". In the first storage region 123a of the word bitmap index 123, a registration number "0123h" corresponding to the word "first" is registered in advance. When having obtained the word "first", the information processing apparatus 100 obtains the compressed code of the word "first" from the bit filter 121 and outputs the obtained compressed code to the compressed file. Further, the information processing apparatus 100 records information indicating that the word "first" appears in the target file 10 into the first storage region 123a of the word bitmap index 123. In the example illustrated in FIG. 1, in the record identified with the registration number "0123h" corresponding to the already-registered word "first" in the first storage region 123a, the value "1" indicating that the word appears in the file is recorded under the file number "3" corresponding to the target file 10. In the first embodiment, the registration numbers and the like are expressed by using hexadecimal numbers. Numbers expressed with hexadecimal numbers each have the letter "h" attached to the end thereof.

In contrast, in the bit filter 121 and the dynamic dictionary unit 122, no compressed code of the lower frequency word "cavy" is registered, initially. When having obtained the word "cavy", because the compressed code of the word "cavy" has not been registered, the information processing apparatus 100 newly assigns a compressed code and a registration number to the word "cavy" and registers the assigned compressed code and registration number into the bit filter 121 and the dynamic dictionary unit 122. Further, the information processing apparatus 100 adds a record corresponding to the registration number of the word "cavy" into the second storage region 123b of the word bitmap index 123 and records the value "1" indicating that the word appears, in the file under the file number "3" corresponding to the target file 10. In the example illustrated in FIG. 1, a record identified with the registration number "2004h" corresponding to the word "cavy" is added to the second storage region 123b, and in the added record, the value "1" indicating that the word appears in the file is recorded under the file number "3" corresponding to the target file 10. In this situation, the added record has recorded therein information indicating that the word does not appear in any other files identified with the file numbers prior to that of the target file 10. In the example illustrated in FIG. 1, the value "0" indicating that the word does not appear is recorded under the file numbers "1" and "2" in the record identified with the registration number "2004h".

Next, a process of generating the bit filter 121 and the word bitmap index 123 performed by the information processing apparatus 100 according to the first embodiment will be explained. The information processing apparatus 100 calculates frequency of appearance of each of the words to be registered into the bit filter 121 from a population. For example, the information processing apparatus 100 calculates the frequency of appearance of each of the words registered in a dictionary, by using a plurality of files as the population. FIG. 2A is a drawing for explaining the frequency of appearance of each of the words. FIG. 2A illustrates a distribution table 20a of the words contained in a population 22 including a file A, a file B, a file C, and so on. The vertical axis of the distribution table 20a expresses the number of words. In the example illustrated in FIG. 2A, it is assumed that the population 22 has approximately 190,000 words registered in a commonly-used dictionary. In the distribution table 20a, the words are arranged in descending order of the frequency of appearance with respect to the number of words in the population 22. In other words, the number of words denotes ranking of appearance of the words in the population. For example, the word "the" having relatively high frequency of appearance in the population 22 is positioned at the number of words "1". In contrast, the word "zymosis" having relatively low frequency of appearance is positioned at the number of words "189,000". In this situation, the word having the lowest frequency of appearance in the population 22 is positioned at the number of words "190,000".

The horizontal axis of the distribution table 20a indicates the code length. For example, to each of the words, a code length corresponding to the frequency of appearance thereof in the population 22 is assigned. In that situation, a shorter code length is assigned to a word having higher frequency of appearance in the population 22, whereas a longer code length is assigned to a word having lower frequency of appearance in the population 22. For example, as indicated in the distribution table 20a, a longer code length is assigned to the word "zymosis", which has lower frequency of appearance than the word "the", which has higher frequency of appearance. In the first embodiment described below, words of which the ranking of frequency of appearance in the population is in the 1st to the 8,000th places will be referred to as higher frequency words. In contrast, words of which the ranking of frequency of appearance in the population is in the 8,001st place or lower will be referred to as lower frequency words. The 8,000th place in the appearance ranking used as the boundary between the higher frequency words and the lower frequency words is merely an example. It is acceptable to use any other place in the appearance raking as the boundary. The words "first" and "was" as well as the words "the", "mouse", and "rat" listed in the distribution table 20a, are each a higher frequency word that is ranked in the 8,000th place or higher. In contrast, the word "cavy" is a lower frequency word that is ranked in the 8,001st place or lower.

The horizontal stripe in the distribution table 20a indicates the position of the number of words corresponding to the appearing word. The distribution table 20a has registered therein all of the 190,000 words acquired from the population 22. For this reason, in the distribution table 20a, the horizontal stripe is uniformly drawn throughout the area from the higher frequency words to the lower frequency words corresponding to the number of words 1 to 190,000.

As indicated in the distribution table 20a, when a code length is assigned to each of the words in accordance with the frequency of appearance of the word in the population 22, a longer code length is assigned to each of the lower frequency words. For example, the lower frequency word "zymosis" is ranked in the 189,000th place in the appearance ranking and is in a lower place in the appearance ranking among the lower frequency words. Thus, a longer code length is assigned to the word "zymosis".

Further, FIG. 2A illustrates a distribution table 20b of the words contained in a compressed file 23 obtained by compressing the target file 10 by using the compressed codes each having the assigned code length. Similarly to the distribution table 20a, the vertical axis expresses the number of words, whereas the horizontal axis expresses the code length in the distribution table 20b. The compressed file 23 has approximately 32,000 words from among the 190,000 words registered in the dictionary. The horizontal stripe in the distribution table 20b expresses the positions of the number of words corresponding to such words that are included in the distribution table 20a and that also appear in the compressed file 23. A large part of the higher frequency words corresponding to the number of words 1 to 8,000 appears in the compressed file 23. For this reason, in the distribution table 20b, the horizontal stripe is uniformly drawn in the area of the higher frequency words corresponding to the number of words 1 to 8,000. In contrast, only a part of the lower frequency words corresponding to the number of words 8,001 to 190,000 appears in the compressed file 23. For this reason, in the distribution table 20b, the horizontal stripe is sparsely drawn in the area of the lower frequency words corresponding to the number of words 8,001 to 190,000.

In this situation, for example, when a code length is assigned to each of the words contained in the compressed file 23 in accordance with the frequency of appearance thereof in the population 22, the code lengths of the lower frequency words vary largely in the compressed file 23, so that a longer code length is assigned to each of the lower frequency words corresponding to smaller numbers of words. For example, to each of the lower frequency words such as "zymosis" that are positioned near the bottom of the distribution table 20b, a longer code length is assigned. For this reason, when a compressing process is performed by using the compressed codes having the code lengths assigned for the compressions of the words, the compression ratio of the compressed file 23 becomes lower because the variable-length codes assigned to the lower frequency words having lower appearance raking are redundant.

Figure 2B:
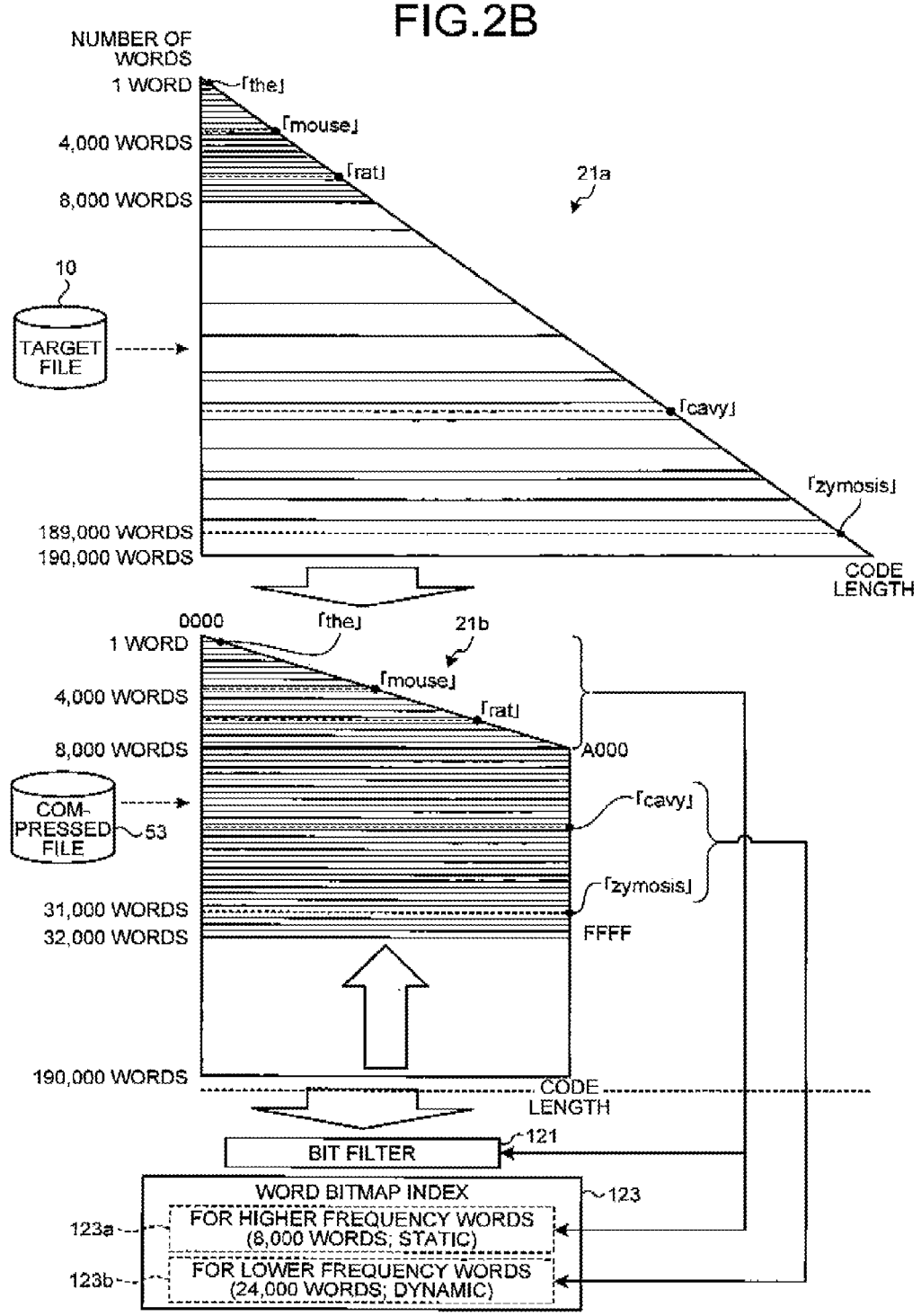
FIG. 2B is a drawing for explaining lengths of compressed codes assigned to words.

To cope with this situation, the information processing apparatus 100 according to the first embodiment performs a compressing process by assigning, in advance, a compressed code of variable-length to each of the higher frequency words in accordance with the frequency of appearance and by assigning a compressed code of fixed-length to each of the lower frequency words upon appearing. FIG. 2B is a drawing for explaining the lengths of the compressed codes assigned to words. Similarly to FIG. 2A, FIG. 2B illustrates a distribution table 21a indicating a distribution of the words contained in the target file 10 within a distribution table of the words contained in the population 22. In the distribution table 21a illustrated in the example of FIG. 2B, the vertical axis expresses the number of words, whereas the horizontal axis expresses the code length, similarly to FIG. 2A. The horizontal stripe in the distribution table 21a indicates the positions of the number of words corresponding to approximately 32,000 words that are among the words included in the population 22 and are acquired from the target file 10 serving as a compression target.

For example, substantially almost all of the higher frequency words of which the appearance ranking is in the 1st to the 8,000th places such as "the", "a", "of", and the like appear in both the population 22 and the target file 10. For this reason, in the distribution table 21a, the horizontal stripe is uniformly drawn for the words corresponding to the numbers of words 1 to 8,000. In contrast, as for the lower frequency words such as "zymosis" of which the appearance ranking is in the 8,001st place or lower, only a part of the words included in the population 22 appears in the target file 10. For this reason, in the distribution table 21a, the horizontal stripe is sparsely drawn for the words corresponding to the numbers of words 8,001 to 190,000. When the code lengths are assigned to the words in accordance with the frequency of appearance in this manner, longer code lengths are assigned to the lower frequency words positioned near the bottom of the distribution table 21a.

To cope with this situation, the information processing apparatus 100 according to the first embodiment assigns variable-length codes to the higher frequency words in descending order of the frequency of appearance. A distribution table 21b indicates the lengths of the compressed codes to be assigned to the words. For example, the information processing apparatus 100 assigns variable-length codes from 1 to 16 bits to the higher frequency words in descending order of the frequency of appearance. For example, in the distribution table 21b, the information processing apparatus 100 assigns compressed codes in the region from "0000h" to "9FFFh" to the higher frequency words corresponding to the number of words 1 to 8,000. Further, the information processing apparatus 100 assigns registration numbers to the higher frequency words. For example, the information processing apparatus 100 sequentially assigns registration numbers to higher frequency words corresponding to the number of words 8,000. For example, while using "0001h" to "2000h" corresponding to the number of words 8,000 as registration numbers for the higher frequency words, the information processing apparatus 100 assigns the registration numbers to the higher frequency words in the order of static codes. The order in which the registration numbers are assigned to the higher frequency words is not limited to the one used in this example. For instance, the registration numbers may be assigned according to the order of the frequency of appearance. Because the registration numbers of the higher frequency words are statically determined for the higher frequency words, the registration numbers of the higher frequency words may hereinafter be referred to as "static numbers".

Further, the information processing apparatus 100 assigns fixed-length codes to lower frequency words in the order the lower frequency words appear in the target file 10. For example, the information processing apparatus 100 assigns 16-bit fixed-length codes to the lower frequency words in the order the lower frequency words appear in the target file 10. For example, the information processing apparatus 100 assigns compressed codes in the region from "A000h" to "FFFFh" to the lower frequency words. As a result, as indicated in the distribution table 21b, fixed-length codes are assigned to the lower frequency words corresponding to 8,001 to 32,000 words, in the order the lower frequency words appear in the target file 10. The lower frequency words corresponding to the numbers of words 8,001 to 190,000 words indicated in the distribution table 21a have lower frequency of appearance. For this reason, the information processing apparatus 100 is able to shorten the code lengths of the assigned codes, by dynamically assigning the fixed-length codes when the lower frequency words appear. For example, as illustrated by the example in FIG. 2B, the code length of the word "zymosis" in the distribution table 21b is shorter than the code length of the word "zymosis" in the distribution table 21a. Further, the information processing apparatus 100 assigns registration numbers to the lower frequency words, in the order the lower frequency words appear. For example, by using the numbers "2001h" and thereafter as the registration numbers of the lower frequency words, the information processing apparatus 100 assigns the registration numbers to the lower frequency words in the order the lower frequency words appear. Because the registration numbers of the lower frequency words are dynamically determined for the lower frequency words, the registration numbers of the lower frequency words may hereinafter be referred to as "dynamic numbers".

The information processing apparatus 100 generates the bit filter 121 by registering therein the compressed codes having the assigned code lengths and the static numbers with respect to the higher frequency words having higher frequency of appearance and not registering therein any compressed codes or dynamic numbers with respect to the lower frequency words. Further, the information processing apparatus 100 generates the word bitmap index 123 by reserving in a fixed manner the first storage region 123a corresponding to all of the higher frequency words and reserving the second storage region 123b which corresponds to a predetermined number of lower frequency words and to which additions can be made. In the example illustrated in FIG. 2B, a storage region corresponding to 24,000 words is reserved as the second storage region 123b, for the purpose of dynamically recording later whether each word appears in the file or not.

Figure 3A:
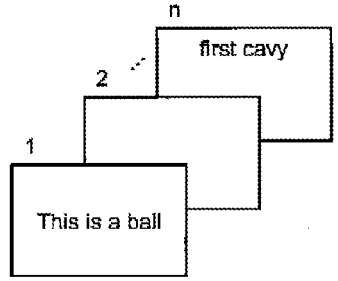
FIG. 3A is a drawing of an example of an index in an N-gram format.

Next, an index will be explained. For example, when an index is configured in the conventional N-gram format, so as to record therein information indicating whether each of N-gram sequences is contained in a file or not, the data size of the index is significantly large. FIG. 3A is a drawing of an examples of an index in the N-gram format. In the index in the N-gram format illustrated in FIG. 3A, the information is stored so as to indicate, for each of 1- to 3-gram sequences, whether the character sequence appears or not in each of the files. For example, the file identified with the file number "1" contains the English text "This is a ball". In that situation, the index in the N-gram format has recorded therein the value "1" indicating that the character sequence appears, under the file number "1" in the records corresponding to "a" and "b", which are each a 1-gram, and "is", which is a 2-gram. As another example, the file identified with the file number "n" contains the English text "fist cavy was". In that situation, the index in the N-gram format has recorded therein the value "1" indicating that the character appears, under the file number "n" in the record corresponding to "a", which is a 1-gram. In this situation, for English texts, indexes are arranged to be in a format of at least 3 grams, in order to reduce search noise. However, when indexes are arranged to be in the N-gram format, the data size is large. Also, when using the N-gram format, search noise may occur.

Figure 3B:
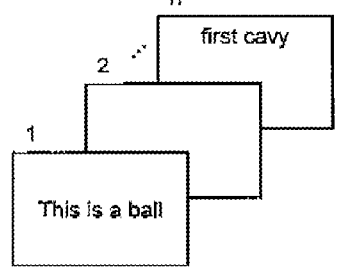
FIG. 3B is a drawing of an example of a word bitmap index.

In contrast, in the first embodiment, the information indicating whether or not each of the words appears is recorded in the word bitmap index 123, for each of the files. FIG. 3B is a drawing of an example of the word bitmap index. In the word bitmap index 123 illustrated in FIG. 3B, for the higher frequency words, the static numbers of the higher frequency words are registered in advance as the registration numbers, and the storage region corresponding only to the higher frequency words is reserved in advance, so as to store therein the information indicating whether each of the higher frequency words appears or not in each of the files. Further, in the word bitmap index 123, for the lower frequency words, the dynamic numbers of the lower frequency words are registered as the registration numbers in the order of appearance in files, so as to store therein the information indicating whether each of the lower frequency words appears in each of the files. For example, the file identified with the file number "1" contains the English text "This is a ball". In that situation, the word bitmap index 123 records therein the value "1" indicating that the word appears, under the file number "1" in the record of the higher frequency word "a". As another example, the file identified with the file number "n" contains the English text "first cavy was" including the lower frequency word "cavy". In that situation, the word bitmap index 123 records therein the value "1" indicating that the word appears, under the file number "n" in the record of the lower frequency word "cavy".

The information processing apparatus 100 is able to inhibit the occurrence of search noise, by recording, in the word bitmap index 123, the information indicating whether or not each of the words appears in each of the files. Further, the information processing apparatus 100 is able to keep the data size small by generating the records in the word bitmap index 123 for the higher frequency words in advance and generating the records in the word bitmap index 123 for the lower frequency words when each word appears.

Figure 4:
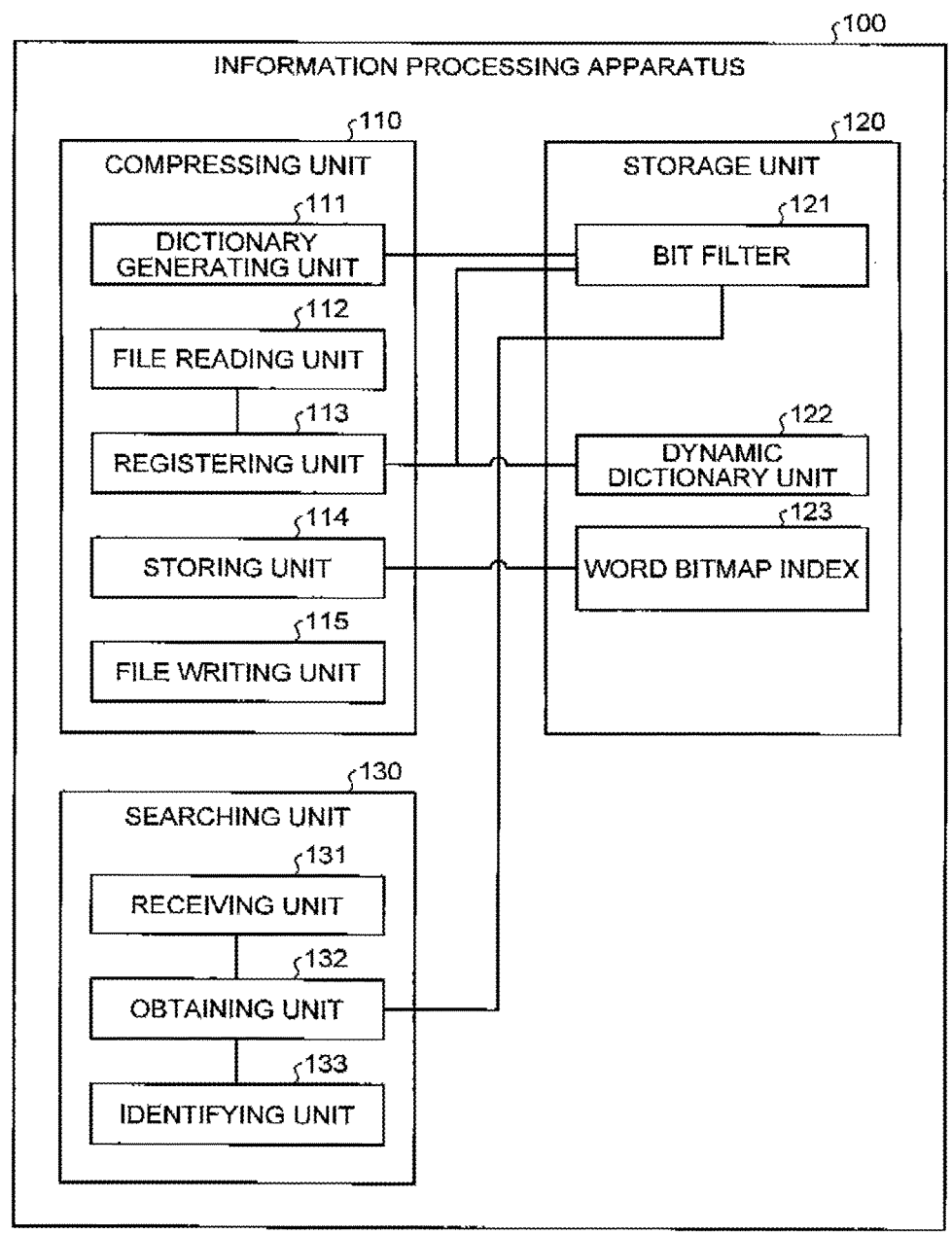
FIG. 4 is a diagram of an exemplary system configuration related to an index generating process according to the first embodiment.

Next, a system configuration related to the index generating process according to the first embodiment will be explained, with reference to FIG. 4. FIG. 4 is a diagram of an exemplary system configuration related to the index generating process according to the first embodiment. As illustrated by the example in FIG. 4, the information processing apparatus 100 includes a compressing unit 110, a storage unit 120, and a searching unit 130. For example, the storage unit 120 corresponds to a storage device such as a semiconductor memory (e.g., a Random Access Memory [RAM], a Read-Only Memory [ROM], a flash memory), a hard disk, or an optical disk.

Further, functions of the compressing unit 110 and the searching unit 130 may be, for example, realized by a Central Processing Unit (CPU) executing a predetermined computer program. Alternatively, functions of the compressing unit 110 and the searching unit 130 may be realized by using an integrated circuit such as an Application Specific Integrated Circuit (ASIC) or a Field Programmable Gate Array (FPGA).

The compressing unit 110 extracts words from a file serving as a compression target (hereinafter, "compression-target file"), assigns a code to each of the words, and stores, into the storage unit 120, the number of times each word has been extracted, for each of the words extracted from the compression-target file, so as to be kept in correspondence with information identifying the compression-target file. The compressing unit 110 includes a dictionary generating unit 111, a file reading unit 112, a registering unit 113, a storing unit 114, and a file writing unit 115. Next, the constituent elements of the compressing unit 110 will be explained in detail.

The dictionary generating unit 111 is a processing unit that generates the bit filter 121 and the word bitmap index 123. The dictionary generating unit 111 acquires the words registered in the dictionary from a predetermined population. For example, the dictionary generating unit 111 acquires approximately 190,000 words from a plurality of text files serving as the population. The dictionary generating unit 111 calculates the frequency of appearance of each of the acquired words in the population and identifies higher frequency words and lower frequency words. The dictionary generating unit 111 registers each of the acquired words into the bit filter 121 as a basic word. For example, the dictionary generating unit 111 assigns a three-byte static code to each of the registered basic words and registers the assigned static codes into the bit filter 121. Further, the dictionary generating unit 111 assigns a compressed code to each of the higher frequency words, in such a manner that the higher the frequency of appearance is, the shorter is the code length, before registering the code lengths and the compressed codes into the bit filter 121. Further, the dictionary generating unit 111 generates the word bitmap index 123. In the word bitmap index 123, the first storage region 123a corresponding to all of the higher frequency words is reserved in a fixed manner. For the lower frequency words, the second storage region 123b which corresponds to a predetermined number of lower frequency words and to which additions can be made is reserved.

Figure 5A:
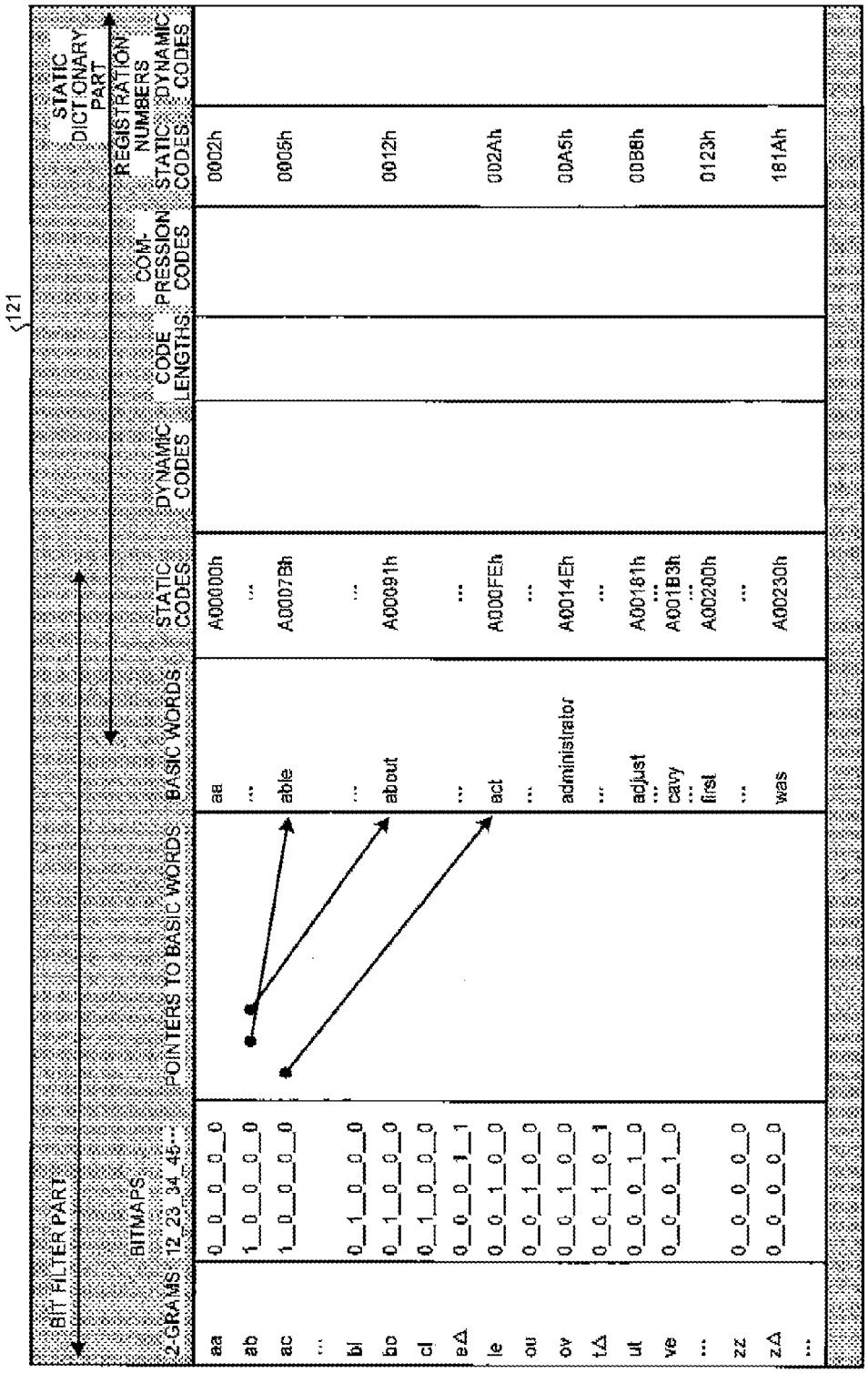
FIG. 5A, is a drawing of an example of a bit filter according to the first embodiment.
Figure 5B:
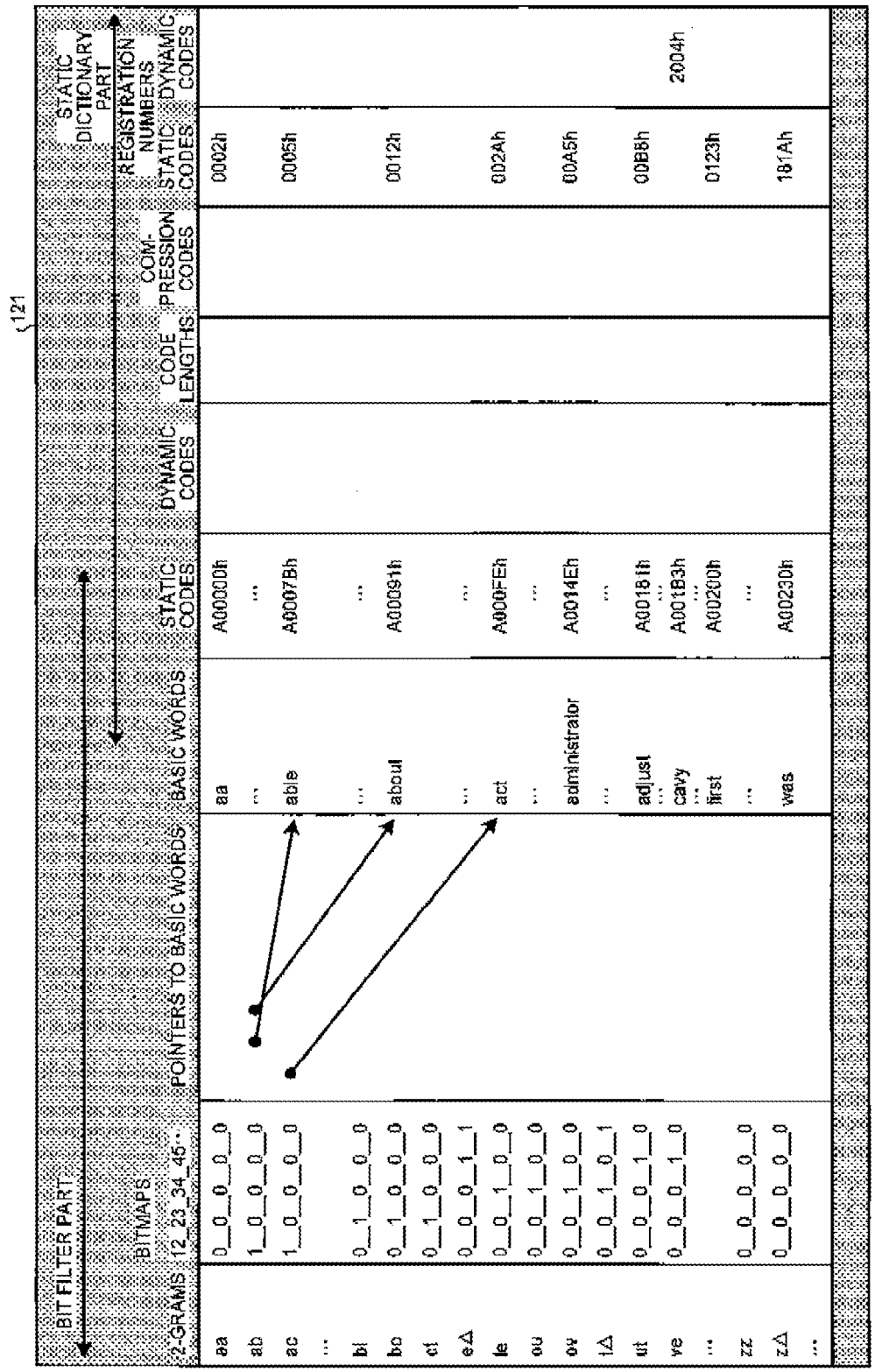
FIG. 5B is another drawing of the example of the bit filter according to the first embodiment.

The bit filter 121 generated by the dictionary generating unit 111 will be explained, with reference to FIGS. 5A and 5B. FIGS. 5A and 5B are drawings of an example of a bit filter according to the first embodiment. As illustrated by the examples in FIGS. 5A and 5B, the bit filter 121 includes 2-grams, bitmaps, pointers to basic words, basic words, static codes, dynamic codes, code lengths, compressed codes, and registration numbers. For the registration numbers, there are separate areas for static numbers and dynamic numbers.

In the "2-grams" column are 2-gram sequences contained in the words. For example, the word "able" contains 2-gram sequences corresponding to "ab", "bl", and "le". The "bitmaps" column indicates the position of the basic word in which each of the 2-gram sequences is contained. For example, when the bitmap of the 2-gram "ab" is indicated as "1_0_0_0_0", the bitmap indicates that the first two characters of the basic word is "ab". Each of the bitmaps is kept in correspondence with the relevant one or more of the basic words by one or more pointers to the basic words. For example, the bitmap "1_0_0_0_0" of the 2-gram "ab" is kept in correspondence with the words "able" and "about".

In the "basic words" column are the words registered in the bit filter 121. For example, the dictionary generating unit 111 registers each of the approximately 190,000 words extracted from the population into the bit filter 121, as a basic word. In the "static codes" column are word codes of three-byte assigned to the basic words in a one-to-one correspondence. In the "dynamic codes" column are the compressed codes of 16-bit (two-bytes) assigned to the lower frequency words appearing in the target file 10. The "dynamic codes" column is blank in the initial state, so that a compressed code is stored therein when the compressed code is assigned to a lower frequency word. In the "code lengths" column are the lengths of the compressed codes assigned to the basic words. In the "compressed codes" column are the compressed codes assigned to the higher frequency words. For example, for a higher frequency word of which the code length is "6", a compressed code of six-bit is stored in the "compressed codes" column. Each of the registration numbers is identification information assigned to a different one of the words. To the higher frequency words, static numbers are sequentially assigned in advance.

In the area for the static numbers among the registration numbers, the assigned static numbers are registered. To the lower frequency words, dynamic numbers are assigned in the order of appearance. In the area for the dynamic numbers among the registration numbers, an assigned dynamic number is stored when a lower frequency word appears. For example, in the bit filter 121 illustrated in FIG. 5A, the dynamic number for the lower frequency word "cavy" is not yet registered. When the lower frequency word "cavy" appears in the file, for example, a dynamic number "2004h" is assigned, so that the dynamic number "2004h" is stored for the lower frequency word "cavy" as illustrated in FIG. 5B. In FIGS. 5A and 5B, the examples are illustrated in which the data for each of the items is stored as a record, while being associated. However, the data may be stored in any other manner, as long as it is possible to maintain the relationships among the items that are associated with one another as explained above.

The file reading unit 112 is a processing unit that reads the target file 10 to be compressed and extracts the words from the target file 10. For example, like in English, when the words in a sentence are separated by predetermined delimiters such as spaces, the file reading unit 112 extracts words from a character string by reading the character string from the target file 10 and separating the character string into the words on the basis of the delimiters in the character string. In contrast, like in Japanese, for example, when words in a sentence are not separated by specific delimiters, the file reading unit 112 reads a character string from the target file 10. Further, the file reading unit 112 extracts words from the character string by performing a natural language processing process suitable for the language of the sentence such as a morphological analysis, a syntax analysis, or the like, on the read character string. The file reading unit 112 outputs the extracted words to the registering unit 113.

The registering unit 113 is a processing unit that registers the compressed code of each of the words extracted from the target file 10 into the dynamic dictionary unit 122. The registering unit 113 refers to the bit filter 121 for the record of the basic word corresponding to the word extracted by the file reading unit 112. The registering unit 113 judges whether the compressed code of the word extracted by the file reading unit 112 is registered in the dynamic dictionary unit 122 or not, on the basis of whether the compressed code is registered under the "dynamic code" in the bit filter 121.

When having determined that the compressed code of the word extracted by the file reading unit 112 is registered in the bit filter 121, the registering unit 113 transfers the process to the storing unit 114.

On the contrary, when having determined that the compressed code of the word extracted by the file reading unit 112 is not registered in the bit filter 121, the registering unit 113 assigns a compressed code to the extracted word. Subsequently, the registering unit 113 obtains a new dynamic number as the registration number of the extracted word and registers the compressed code into the dynamic dictionary unit 122 so as to be kept in correspondence with the dynamic number.

Figure 6:
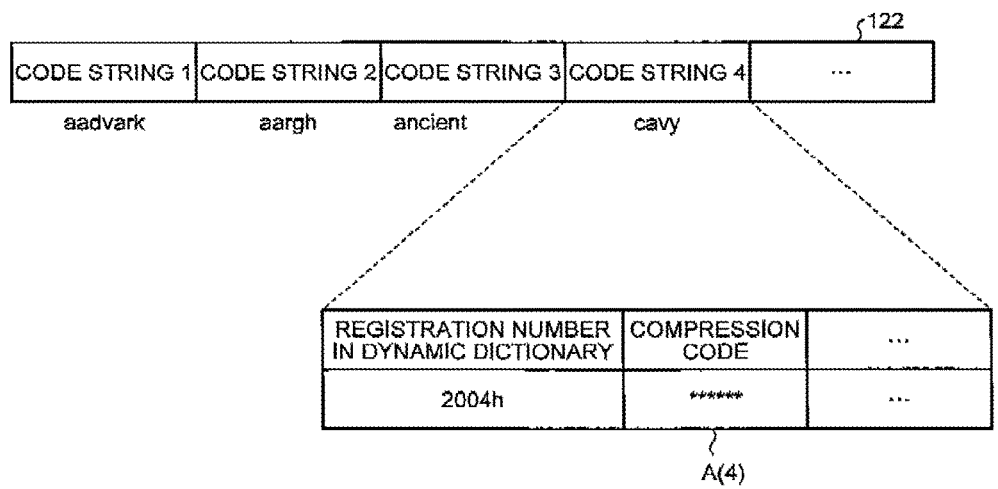
FIG. 6 is a drawing of an exemplary data structure of a dynamic dictionary unit according to the first embodiment.

The registration of the compressed code into the dynamic dictionary unit 122 will be explained, with reference to FIG. 6. FIG. 6 is a drawing of an exemplary data structure of the dynamic dictionary unit according to the first embodiment. As illustrated by the example in FIG. 6, the dynamic dictionary unit 122 has stored therein "aadvark" as code string 1, "aargh" as code string 2, and "ancient" as code string 3. When the file reading unit 112 has extracted "cavy", the registering unit 113 registers "cavy" as code string 4. For example, the registering unit 113 registers the compressed code of "cavy" and the dynamic number "2004h" in the dynamic dictionary unit 122 that are kept in correspondence with each other into a data region A(4) of code string 4. Further, the dynamic dictionary unit 122 may store therein other pieces of data. For example, the dynamic dictionary unit 122 may store therein a static code of any registered word so as to be kept in correspondence therewith.

Subsequently, the registering unit 113 registers the registration number into the bit filter 121. As a result of setting the registration numbers of the words in this manner, the bit filter 121 is brought into correspondence with the code strings registered in the dynamic dictionary unit 122 by the registration numbers. Further, the registering unit 113 registers the compressed code registered in the dynamic dictionary unit 122, into the dynamic code column in the bit filter 121.

The storing unit 114 is a processing unit that stores the information into the word bitmap index 123. The word bitmap index 123 is an index that stores therein the information indicating, for each of the words, whether the word appears or not. The word bitmap index 123 stores therein the information indicating, for each of the words, whether the word appears or not in each of the files. The storing unit 114 judges whether or not the registration number (i.e., either the static number or the dynamic number) of the word extracted by the file reading unit 112 is registered in the word bitmap index 123.

When having determined that the registration number is registered, the storing unit 114 records information indicating that the word appears, under the file number corresponding to the target file 10, in the record that is stored in the word bitmap index 123 and is identified with the registration number of the extracted word.

On the contrary, when having determined that the registration number is not registered, the storing unit 114 adds a record with the dynamic number of the extracted word to the second storage region 123*b* of the word bitmap index 123 and records information indicating that the word appears, under the file number corresponding to the target file 10.

Figure 7:
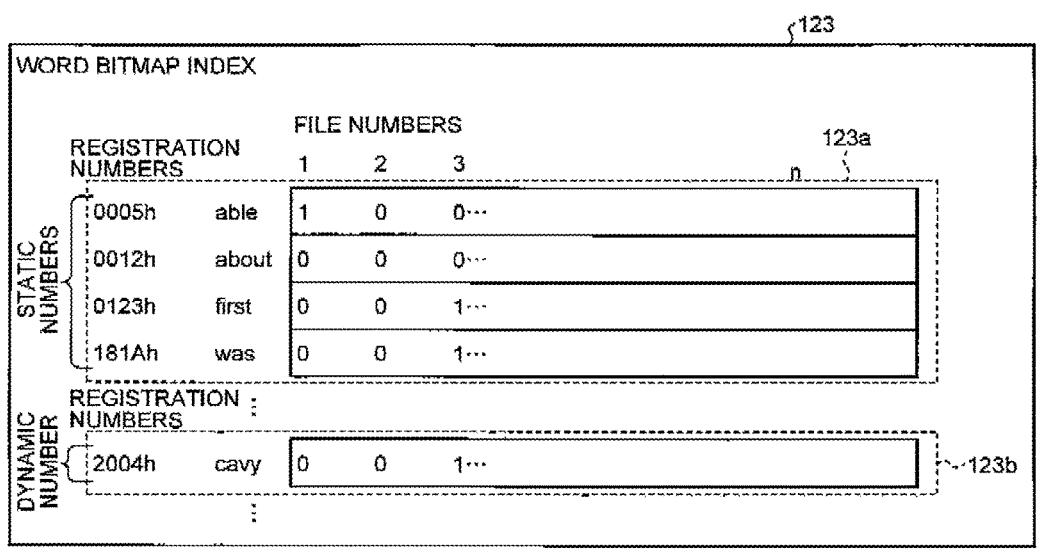
FIG. 7 is a drawing of an example of a word bitmap index according to the first embodiment.

An updating process of the word bitmap index 123 will be explained, with reference to FIG. 7. FIG. 7 is a drawing of an example of the word bitmap index according to the first embodiment. When the dynamic number "2004h" of the word "cavy" is not registered in the word bitmap index 123, the storing unit 114 adds a record to the word bitmap index 123 so as to be kept in correspondence with the dynamic number of the word "cavy". Further, the storing unit 114 records the value "1" indicating that the word appears, into the added record, under the file number "3" corresponding to the file from which the "cavy" was extracted.

On the contrary, when the dynamic number of the word "cavy" is registered in the word bitmap index 123, the storing unit 114 records the value "1" indicating that the word appears, under the file number "3" in the record corresponding to the dynamic number of the word "cavy".

The file writing unit 115 is a processing unit that assigns a compressed code to each of the words extracted by the file reading unit 112 and writes the compressed code to a compressed file. The file writing unit 115 obtains the compressed code corresponding to the word extracted by the file reading unit 112, from the bit filter 121. The file writing unit 115 outputs the obtained compressed code to the compressed file. Further, the file writing unit 115 outputs each of the higher frequency words and the frequency of appearance of the higher frequency word in the population to the compressed file, while keeping the word and the frequency of appearance in correspondence with each other. For example, the file writing unit 115 records the higher frequency words and the frequency of appearance of the higher frequency words in the population into a header of the compressed file, in an order based on the frequency of appearance. Further, the file writing unit 115 outputs the dynamic dictionary unit 122 to the compressed file. For example, the file writing unit 115 records the dynamic dictionary unit 122 into a footer of the compressed file. When the compressed file is decompressed, the decompression is performed on the basis of the dynamic dictionary unit 122 with respect to the lower frequency words. With respect to the higher frequency words, the compressed file is decompressed by obtaining the compressed codes of the higher frequency words on the basis of the frequency of appearance of the higher frequency words recorded in the compressed file.

The searching unit 130 searches for one or more compression-target files each having a high level of similarity to a search-target character string. The searching unit 130 includes a receiving unit 131, an obtaining unit 132, and an identifying unit 133. Next, the constituent elements of the searching unit 130 will be explained in detail.

The receiving unit 131 is a processing unit that receives the search-target character string. The receiving unit 131 provides an input interface for receiving the search-target character string, so as to receive the search-target character string.

The obtaining unit 132 is a processing unit that identifies one or more compressed files each containing any of the words included in the search-target character string. By referring to the static number area and the dynamic number area of the bit filter 121, the obtaining unit 132 identifies the registration numbers of the words contained in the search-target character string received by the receiving unit 131. The obtaining unit 132 judges whether a record corresponding to each of the registration numbers is registered in the word bitmap index 123. When a record corresponding to any of the registration numbers is registered in the word bitmap index 123, the obtaining unit 132 obtains the one or more compressed files containing the words included in the search-target character string, on the basis of the records corresponding to the registration numbers.

The identifying unit 133 is a processing unit that identifies the one or more files each containing the search-target character string. The identifying unit 133 identifies one or more compressed files each having a high level of similarity to the search-target character string, on the basis of the obtainment result of the obtaining unit 132. For example, the identifying unit 133 identifies a file that contains all of the words included in the search-target character string, or some of the words in a quantity equal to or larger than a predetermined value, or some of the words equal to or larger than a predetermined percentage, as a file containing the search-target character string. The method for identifying the file containing the search-target character string described above is merely an example. Possible embodiments are not limited to this example. For instance, it is also acceptable to list the files in ranking in such a manner that the more words in a file match the words contained in the search-target character string, the higher the level of similarity of the file is.

As explained above, the information processing apparatus 100 is able to inhibit the occurrence of search noise, because the index is arranged to be the word bitmap index 123 that has recorded therein the information indicating, for each of the words, whether the word is contained in each of the files. Further, the information processing apparatus 100 is able to keep the data size of the word bitmap index 123 small, by recording into the word bitmap index 123 whether the word appears or not, for each of the words extracted from the compression-target file. Further, by using the word bitmap index 123, the information processing apparatus 100 is able to quickly search for the one or more files having a high level of similarity, without the need to decompress and search in the compressed file.

Figure 8:
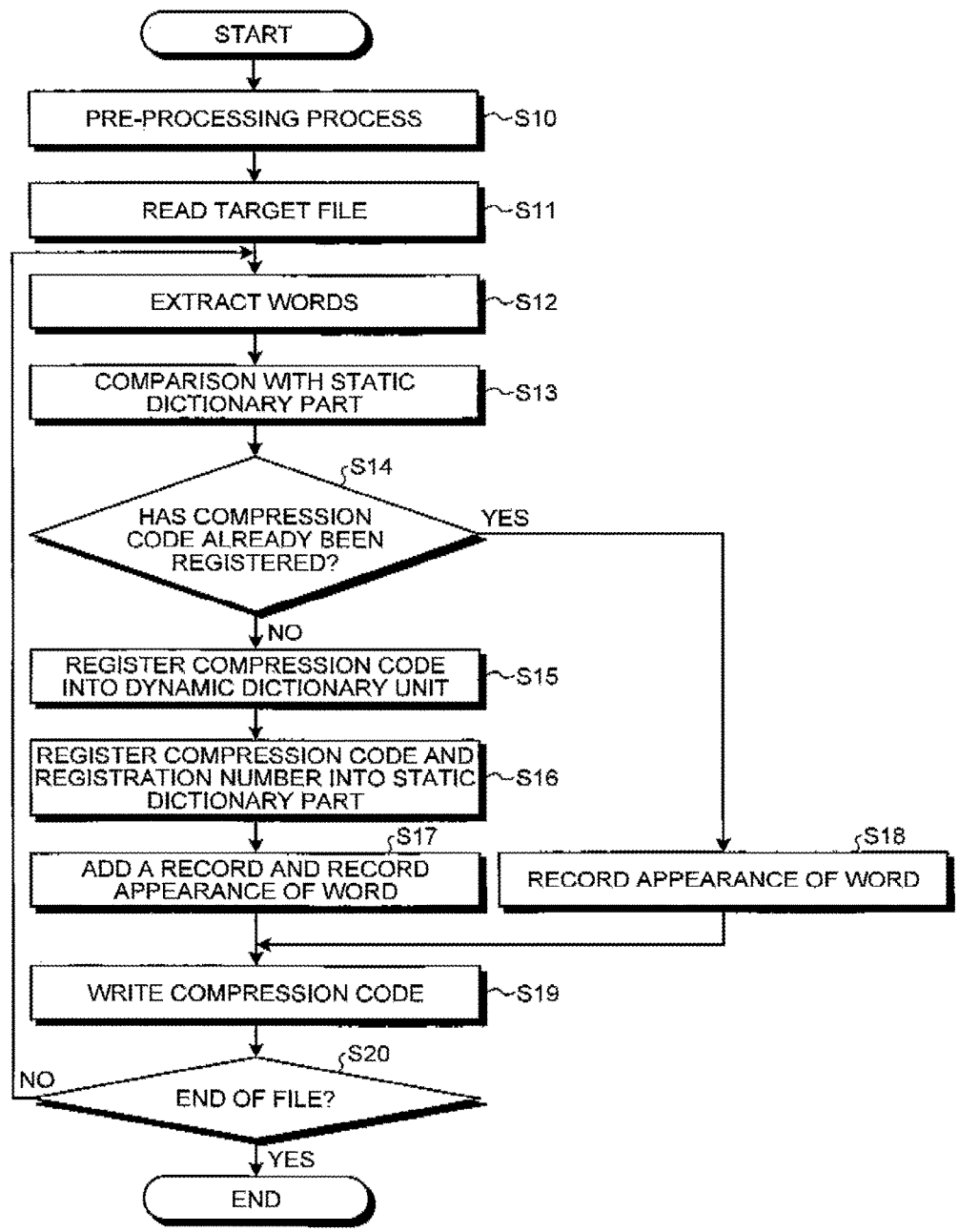
FIG. 8 is a flowchart of an exemplary flow in the index generating process according to the first embodiment.

Next, a flow in an index generating process according to the first embodiment will be explained, with reference to FIG. 8. FIG. 8 is a flowchart of an exemplary flow in the index generating process according to the first embodiment. As illustrated by the example in FIG. 8, the compressing unit 110 performs a pre-processing process (step S10). For example, the compressing unit 110 reserves a storage region used for registering the compressed codes into the dynamic dictionary unit 122, as the pre-processing process. Further, the dictionary generating unit 111 generates the word bitmap index 123 by calculating the frequency of appearance of each of the words in a predetermined population and identifying higher frequency words and lower frequency words, as the pre-processing process. Further, the dictionary generating unit 111 generates the bit filter 121, as the pre-processing process.

The file reading unit 112 reads the target file (step S11) and extracts the words from the target file (step S12). The registering unit 113 compares each of the extracted words with the static dictionary part of the bit filter 121 (step S13).

In the static dictionary part of the bit filter 121, the storing unit 114 refers to the dynamic code and the compressed code in the record of the basic word corresponding to the extracted word and judges whether the compressed code has already been registered (step S14). When the compressed code has already been registered in the record of the basic word (step S14: Yes), the storing unit 114 records information indicating that the word appears, into the record in the word bitmap index 123 corresponding to the registration number (i.e., either the static number or the dynamic number) of the extracted word (step S18). Subsequently, the storing unit 114 proceeds to the process at step S19.

On the contrary, when the compressed code has not been registered in the record of the basic word (step S14: No), the registering unit 113 assigns a compressed code and a dynamic number to the word and registers the compressed code into the dynamic dictionary unit 122 so as to be kept in correspondence with the dynamic number (step S15). Subsequently, the registering unit 113 registers the compressed code and the dynamic number of the word into the static dictionary part of the bit filter 121 (step S16). The storing unit 114 adds a record with the dynamic number of the extracted word to the second storage region 123b of the word bitmap index 123 and records information indicating that the word appears in the file, under the file number corresponding to the target file 10 (step S17).

The file writing unit 115 writes the compressed code corresponding to the word extracted by the file reading unit 112, to the compressed file (step S19).

The file reading unit 112 judges whether the file has been read up to the end of the file (step S20). When the file has been read up to the end of the file (step S20: Yes), the file reading unit 112 ends the process. On the contrary, when the file reading position has not yet reached the end of the file (step S20: No), the file reading unit 112 returns to the process at step S12.

Figure 9:
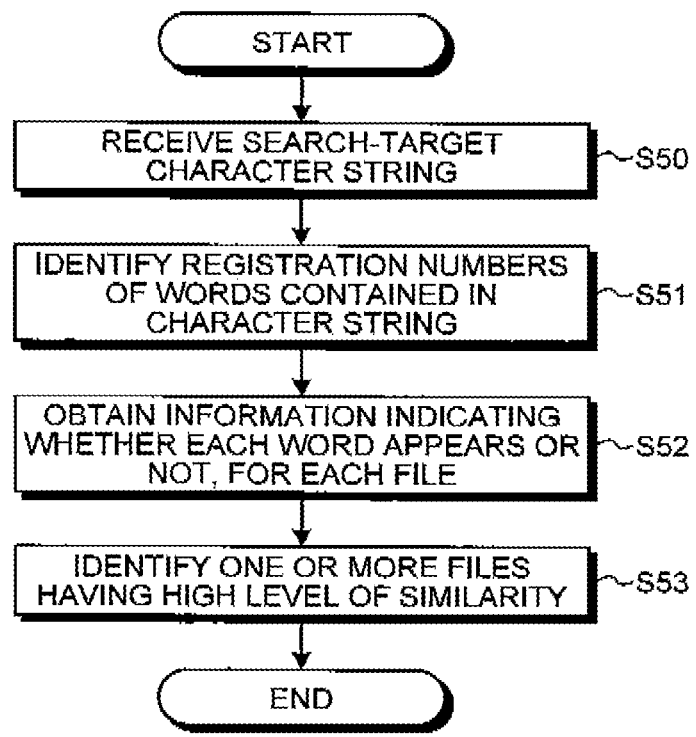
FIG. 9 is a flowchart of an exemplary flow in a searching process according to the first embodiment.

Next, a flow in a searching process according to the first embodiment will be explained, with reference to FIG. 9. FIG. 9 is a flowchart of an exemplary flow in the searching process according to the first embodiment. As illustrated by the example in FIG. 9, the receiving unit 131 receives a search-target character string (step S50).

The obtaining unit 132 refers to the bit filter 121 and identifies the registration numbers on the basis of either the static number or the dynamic number of each of the words contained in the search-target character string (step S51). On the basis of the registration numbers, the obtaining unit 132 obtains the information indicating whether each of the words contained in the search-target character string appears in each of the compressed files, from the word bitmap index 123 (step S52). On the basis of the obtainment result, the identifying unit 133 identifies one or more compression-target files each having a high level of similarity to the search-target character string (step S53) and ends the process.

As explained above, the information processing apparatus 100 extracts the words from the compression-target file and assigns the codes to the words. For each of the words extracted from the compression-target file, the information processing apparatus 100 stores the information indicating whether the word appears or not into the storage unit 120, so as to be kept in correspondence with the information identifying the compression-target file. By generating the index corresponding to each of the words contained in the file in this manner, the information processing apparatus 100 is able to inhibit the occurrence of search noise, while keeping the data size of the index small.

[b] Second Embodiment

Next, a second embodiment will be explained. In the second embodiment, an example will be explained in which the index is arranged to be a count-map-type index that stores therein information indicating the number of times each word has appeared in each file, so as to record the number of times of appearance for each word and for each synonym.

Figure 10:
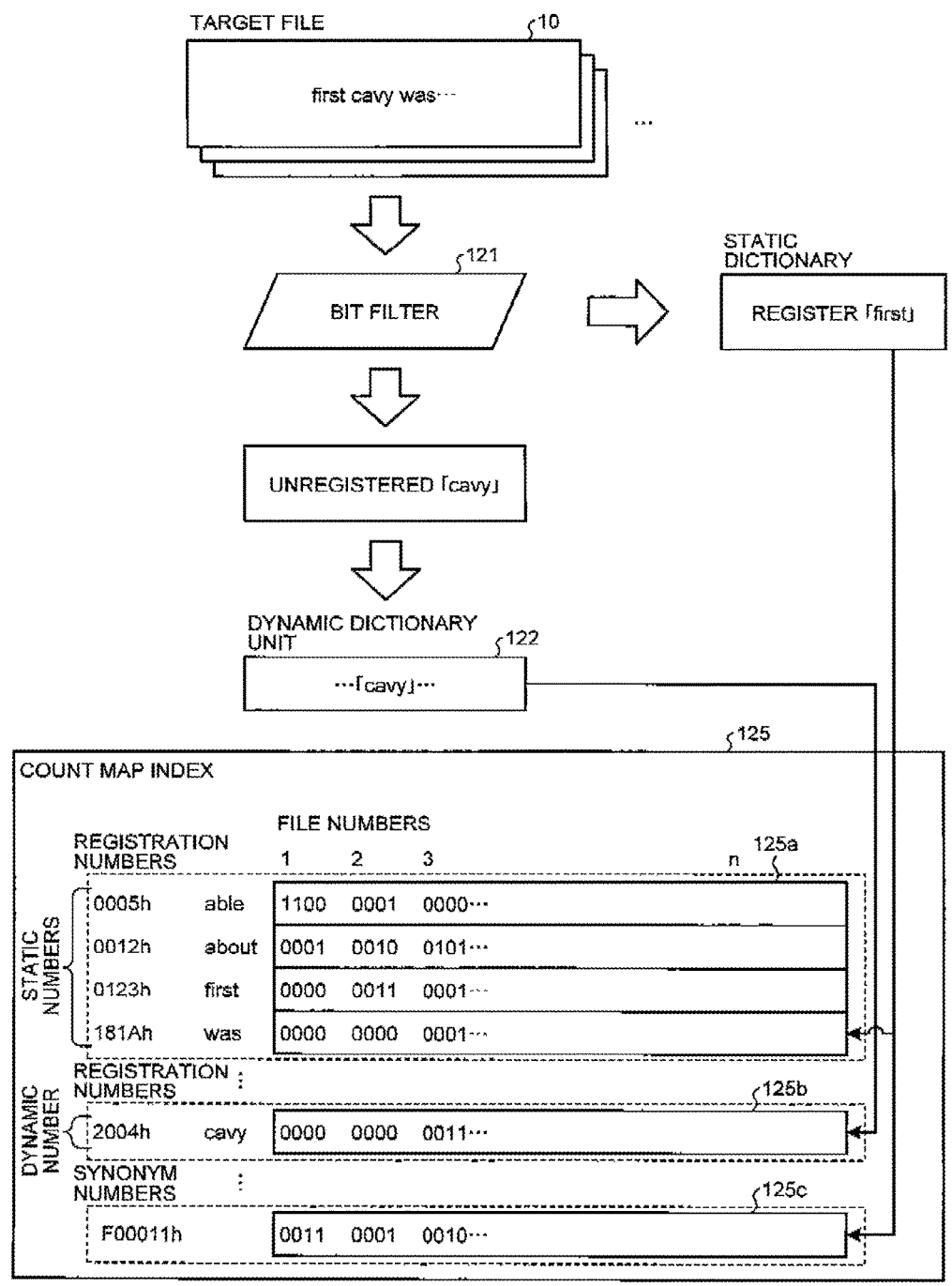
FIG. 10 is a drawing of a flow in a process of generating an index according to a second embodiment.

FIG. 10 is a drawing of a flow in a process of generating an index according to the second embodiment. Because the flow in the process illustrated in FIG. 10 is partially the same as that illustrated in FIG. 1, differences will mainly be explained. FIG. 10 illustrates an example in which an index is generated with respect to the sentence "first cavy was . . . " contained in the target file 10 to be compressed. The information processing apparatus 100 obtains the words from a document included in the target file 10, in units of words. In the example illustrated in FIG. 10, the information processing apparatus 100 obtains "first", "cavy", and "was". The information processing apparatus 100 compares the obtained words with the bit filter 121. Further, the information processing apparatus 100 records the number of times each of the compared words is contained in the target file 10, into a count map index 125.

The count map index 125 is an index storing therein the number of times each of the words has appeared, for each of the files. The count map index 125 is provided with a first storage region 125a for storing therein the number of times each of the higher frequency words has appeared in each of the files and a second storage region 125b for storing therein the number of times each of the lower frequency words has appeared in each of the files. Further, the count map index 125 is provided with a third storage region 125c for storing therein the number of times synonyms related to the appearing word have appeared in each of the files. The first storage region 125a is provided, in advance, for storing therein the number of times each of the higher frequency words has appeared in the target file 10. In other words, in the first storage region 125a, a storage region corresponding only to the higher frequency words is reserved in advance. For instance, in the example illustrated in FIG. 10, the first storage region 125a is provided, in advance, with a counter storing therein the number of times each of the higher frequency words has appeared in each of the files of which the quantity is equal to n. In the second storage region 125b, when a lower frequency word appears in the target file 10, a counter is additionally provided so as to store therein the number of times the appearing lower frequency word has appeared in each of the files. In other words, in the second storage region 125b, every time a new lower frequency word appears in the target file 10, a storage region is reserved. The third storage region 125c is provided in advance for storing therein, for each type of synonyms, the number of times synonyms have appeared in the target file 10. In other words, in the third storage region 125c, as many storage regions as the number of types of synonyms are reserved, in advance.

When the compared word is a higher frequency word, the information processing apparatus 100 records the number of times of appearance of the compared word into the first storage region 125a. In contrast, when the compared word is a lower frequency word, the information processing apparatus 100 records the number of times of appearance of the compared word into the second storage region 125b. Further, when a type of synonyms including the compared word is present, the information processing apparatus 100 records the number of times of appearance for the type of synonyms including the compared word, into the third storage region 125c.

Figure 11:
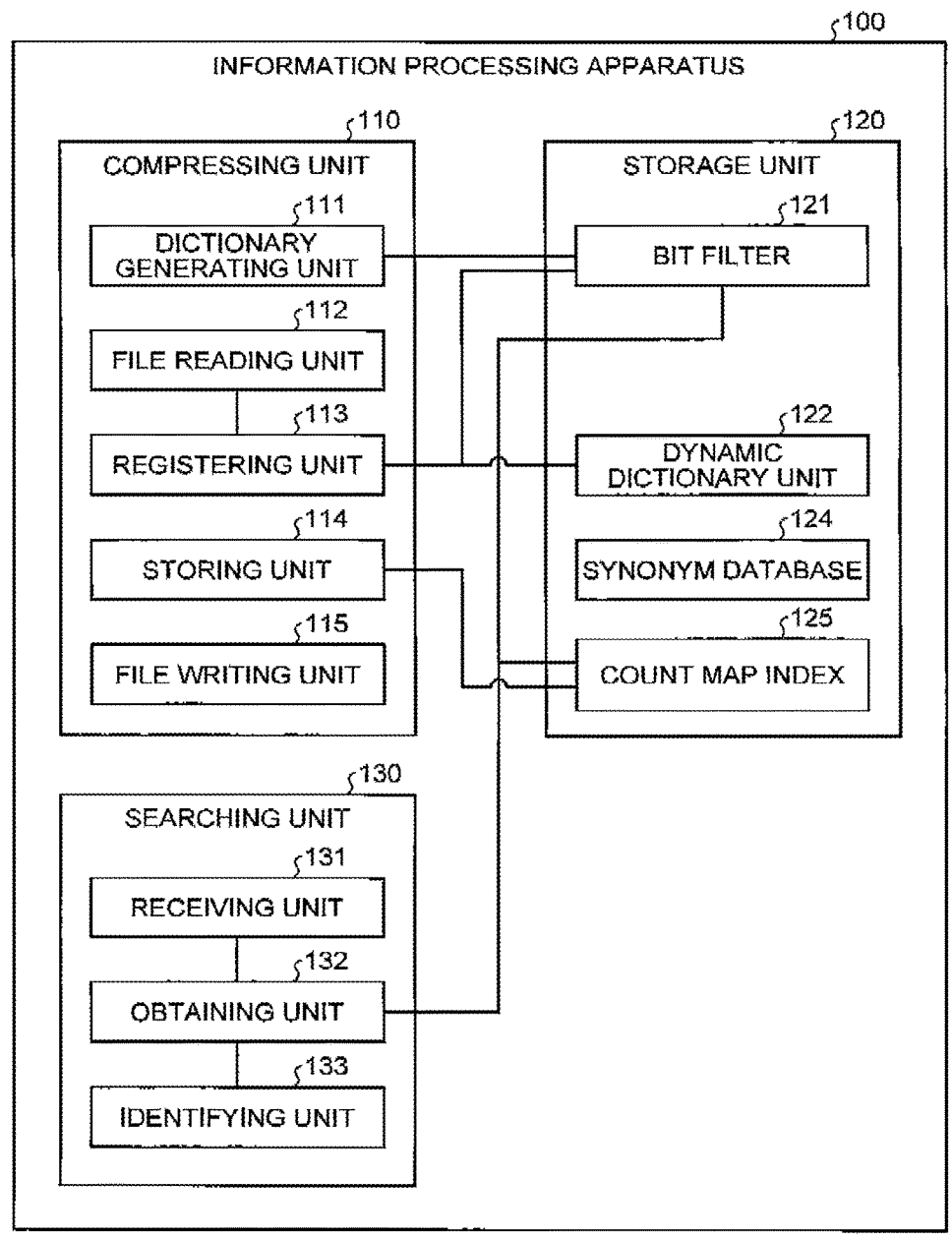
FIG. 11 is a diagram of an exemplary system configuration related to an index generating process according to the second embodiment.

Next, a system configuration related to an index generating process according to the second embodiment will be explained, with reference to FIG. 11. FIG. 11 is a diagram of an exemplary system configuration related to the index generating process according to the second embodiment. Because the information processing apparatus 100 illustrated in FIG. 11 is partially the same as that illustrated in FIG. 4, differences will mainly be explained.

The storage unit 120 further stores therein a synonym database 124. The synonym database 124 is data storing therein information related to synonymous words. For example, the synonym database 124 has registered therein synonymous words for each of the groups of synonymous words.

The synonym database 124 will be explained, with reference to FIG. 12. FIG. 12 is a drawing of an exemplary data structure of a synonym database according to the second embodiment. As illustrated by the example in FIG. 12, the synonym database 124 includes synonym numbers and synonyms. The "synonym numbers" are pieces of identification information determined for identifying types of synonyms. As the synonym numbers, codes that are assigned so as not to duplicate the static numbers and the dynamic numbers are stored. In the "synonyms" column are words that are synonymous to one another. As the synonyms, for example, a plurality of words that are synonymous to one another are stored, on the basis of a thesaurus. For example, the thesaurus may contain approximately 1,600 types of synonyms. In the example illustrated in FIG. 12, in the synonym database 124, the words "mouse", "rat", "cavy", and so on are registered while being kept in correspondence with the synonym number "F00011h".

The dictionary generating unit 111 is a processing unit that generates the bit filter 121 and the count map index 125. The dictionary generating unit 111 acquires the words registered in the dictionary from a predetermined population. The dictionary generating unit 111 calculates frequency of appearance of each of the acquired words in the population and identifies the higher frequency words and the lower frequency words. The dictionary generating unit 111 registers each of the acquired words into the bit filter 121 as a basic word. For example, the dictionary generating unit 111 assigns a three-byte static code to each of the registered basic words and registers the assigned static codes into the bit filter 121. Further, the dictionary generating unit 111 assigns a compressed code to each of the higher frequency words, in such a manner that the higher the frequency of appearance is, the shorter is the code length, before registering the code lengths and the compressed codes into the bit filter 121. Further, when any of the higher frequency words is registered in the synonym database 124, the dictionary generating unit 111 registers the synonym number of the type of synonyms including the higher frequency word, into the bit filter 121. In addition, the dictionary generating unit 111 generates the count map index 125. In the count map index 125, the first storage region 125a corresponding to all of the higher frequency words is reserved in a fixed manner. For the lower frequency words, the second storage region 125b which corresponds to a predetermined number of lower frequency words and to which additions can be made is reserved. The third storage region 125c corresponding to the number of types of synonyms is reserved in a fixed manner.

Figure 13A:
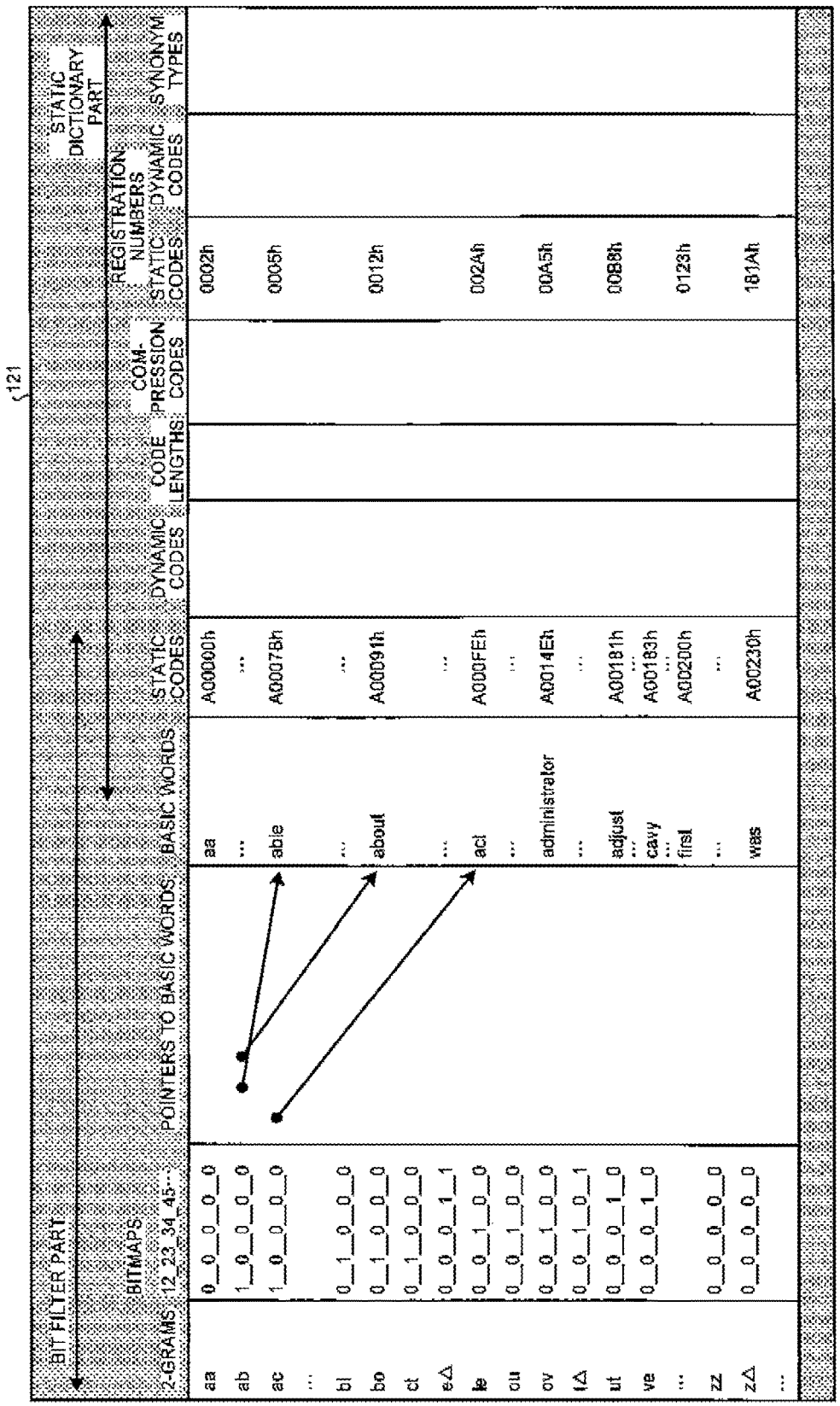
FIG. 13A is a drawing of an example of a bit filter according to the second embodiment.
Figure 13B:
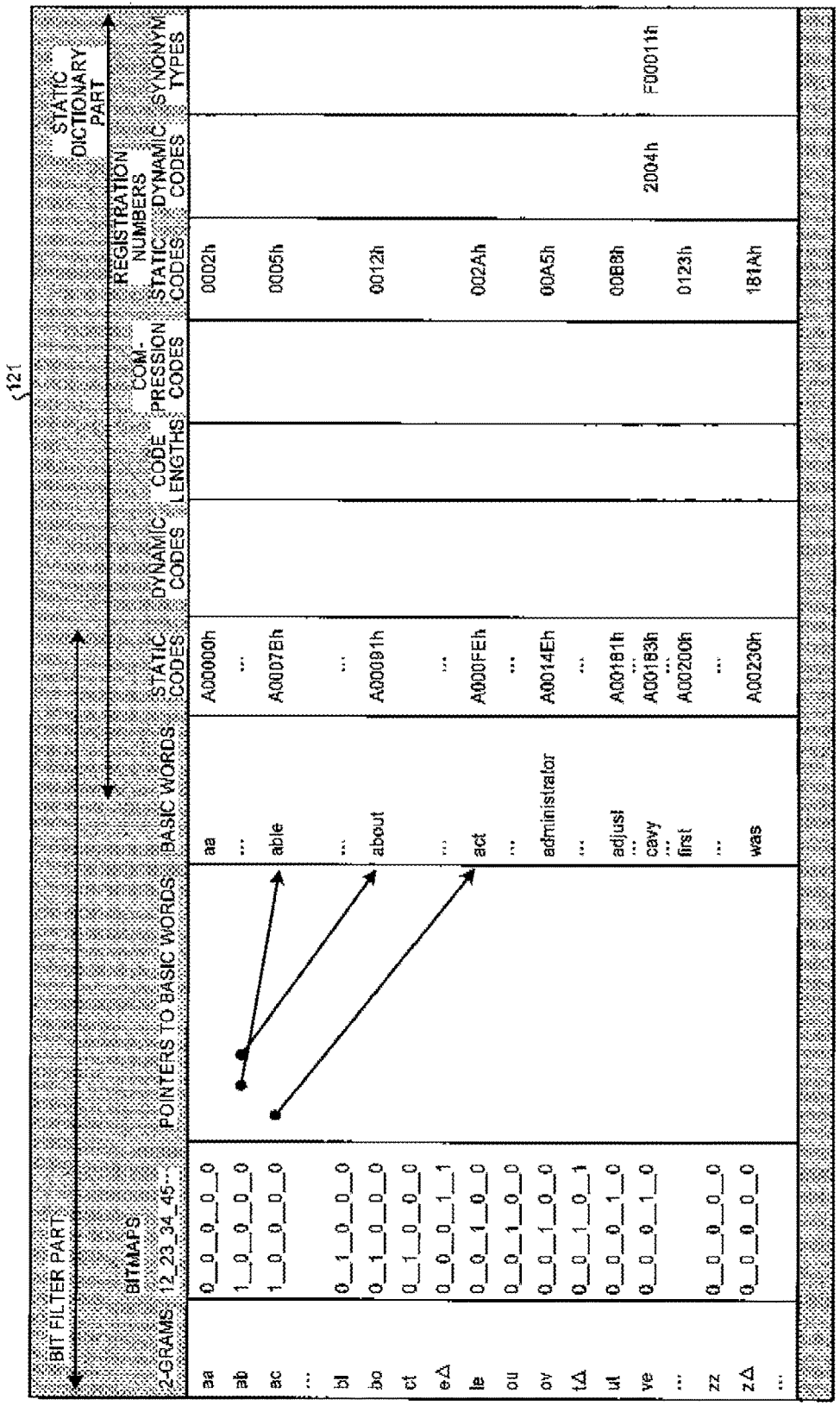
FIG. 13B is another drawing of the example of the bit filter according to the second embodiment.

FIGS. 13A and 13B are drawings of an example of the bit filter according to the second embodiment. Because the bit filter 121 illustrated in FIGS. 13A and 13B are partially the same as that illustrated in FIGS. 5A and 5B, differences will mainly be explained. The bit filter 121 further includes synonym types. The "synonym types" denotes types of synonyms. When any word has one or more synonyms, synonym information indicating the type of synonyms to which the word belongs is stored in the "synonym type" column. For example, in the bit filter 121 illustrated in FIG. 13A, with respect to the lower frequency word "cavy" having synonyms, no dynamic number has been registered as the registration number, and no synonym type has been registered, either. When the lower frequency word "cavy" appears in a file, for example, a dynamic number "2004h" is assigned thereto, and as illustrated in FIG. 13B, with respect to the lower frequency word "cavy", the dynamic number "2004h" is stored as the registration number, and the synonym number "F00011h" is stored as the synonym type.

The storing unit 114 is a processing unit that stores information into the count map index 125. The count map index 125 is an index that stores therein, for each of the words, the number of times the word has appeared. The count map index 125 stores therein, for each of the words, the number of times of appearance of the word in each of the files. The storing unit 114 judges whether or not a registration number (i.e., either a static number or a dynamic number) of the word extracted by the file reading unit 112 is registered in either the first storage region 125a or the second storage region 125b of the count map index 125.

When having determined that the registration number is registered, the storing unit 114 records the number of times of appearance of the word under the file number corresponding to the target file 10 in the record that is stored in the count map index 125 and is identified with the registration number of the extracted word.

On the contrary, when having determined that the registration number is not registered, the storing unit 114 adds a record with the dynamic number of the extracted word to the second storage region 125b of the count map index 125. After that, the storing unit 114 records the number of times of appearance of the word into the added record, under the file number corresponding to the target file 10.

Further, the storing unit 114 judges whether or not the synonym number of the word extracted by the file reading unit 112 is registered in the third storage region 125*c* of the count map index 125.

When having determined that the synonym number is registered, the storing unit 114 records the number of times of appearance of the synonyms under the file number corresponding to the target file 10, in the record that is stored in the count map index 125 and is identified with the synonym number of the extracted word.

On the contrary, when having determined that the synonym number is not registered, the storing unit 114 adds a record with the synonym number of the extracted word, to the third storage region 125*c* of the count map index 125. Further, the storing unit 114 records the number of times of appearance of the synonyms into the added record, under the file number corresponding to the target file 10.

Next, an updating process of the count map index 125 will be explained with reference to FIG. 14. For example, when the word "cavy" is extracted from a file corresponding to the file number "3", because a record corresponding to the dynamic number of the word "cavy" is present in the second storage region 125*b*, the storing unit 114 records the number of times of appearance of the word under the file number "3" in the record.

When the synonym number of the word "cavy" is not registered in the third storage region 125*c* of the count map index 125, the storing unit 114 adds a record to the third storage region 125*c* of the count map index 125, so as to be kept in correspondence with the synonym number "F00011h" of the word "cavy". Further, the storing unit 114 records the number of times of appearance of the word under the file number "3".

On the contrary, when the synonym number of the word "cavy" is registered in the third storage region 125*c* of the count map index 125, the storing unit 114 records the number of times of appearance of the synonyms under the file number "3" in the record corresponding to the synonym number of the word "cavy".

In the count map index 125 illustrated in FIG. 14, the counter that records the number of times of appearance is configured with four bits; however, the number of bits of the counter is not limited to this example. Further, it is also acceptable to configure the counter so as to correspond to the number of times of appearance in a discrete manner. For example, the storing unit 114 may record the number of times of appearance in correspondence with a value of the counter in an exponential manner, e.g., the number of times of appearance "1" in correspondence with the value "1" of the counter, the number of times of appearance "3" in correspondence with the value "2" of the counter, and the number of times of appearance "7" in correspondence with the value "3" of the counter.

The obtaining unit 132 refers to the static number area and the dynamic number area of the bit filter 121 and identifies the registration number of each of the words contained in the search-target character string received by the receiving unit 131. Further, the obtaining unit 132 refers to the synonym type area of the bit filter 121 and identifies the synonym number of each of the words contained in the search-target character string received by the receiving unit 131. After that, the obtaining unit 132 obtains the number of times of appearance of each of the words in each of the compressed files, from the record corresponding to the registration number in the count map index 125, as the number of times the word has been extracted. Further, the obtaining unit 132 obtains the number of times of appearance of synonyms in each of the compressed files, from the record corresponding to the synonym number in the count map index 125, as the number of times the synonym information to which the word belongs has been extracted.

The identifying unit 133 is a processing unit that identifies one or more files each containing a character string having a high level of similarity to the search-target character string. The identifying unit 133 identifies the one or more compression-target files each having a high level of similarity to the search-target character string, on the basis of the number of times the word obtained by the obtaining unit 132 has been extracted and the number of times the synonym information has been extracted. For example, the identifying unit 133 calculates a score for each of the files, by performing a weighted calculation on the number of times the word has been extracted and the number of times synonyms have appeared. For example, the identifying unit 133 calculates the score by multiplying the number of times the word has been extracted by a larger weight value, multiplying the number of times the synonyms have appeared by a smaller weight valve, and adding together all the multiplication results. The larger the numbers of times the word has been extracted and the synonyms have been extracted, the larger the value of the score is. On the basis of the scores, the identifying unit 133 identifies the one or more files each containing a character string having a high level of similarity to the search-target character string. For example, the identifying unit 133 identifies one or more files of which the score is in a rank equal to or higher than a predetermined level or of which the score is equal to or higher than a predetermined threshold value, as the files having a high similarity. The identifying unit 133 outputs the identified files as a search result. The method for calculating the scores described above is merely an example, and possible embodiments are not limited to this example. It is acceptable to use any calculation method as long as it is possible to calculate a higher score for a file from which the word and the synonyms thereof have been extracted a larger number of times.

As explained above, the information processing apparatus 100 is able to inhibit the occurrence of search noise, by arranging the index to be the count map index 125 that records therein, for each of the words, the information indicating whether the word is contained in each of the files. Further, the information processing apparatus 100 is able to keep the data size of the count map index 125 small, by recording in the count map index 125 the number of times the word has been extracted and the number of times the synonyms have been extracted, for each of the words extracted from the compression-target file. Further, by using the word bitmap index 123, the information processing apparatus 100 is able to quickly search for the one or more files having a high level of similarity, without the need to decompress and search in the compressed file.

Figure 15:
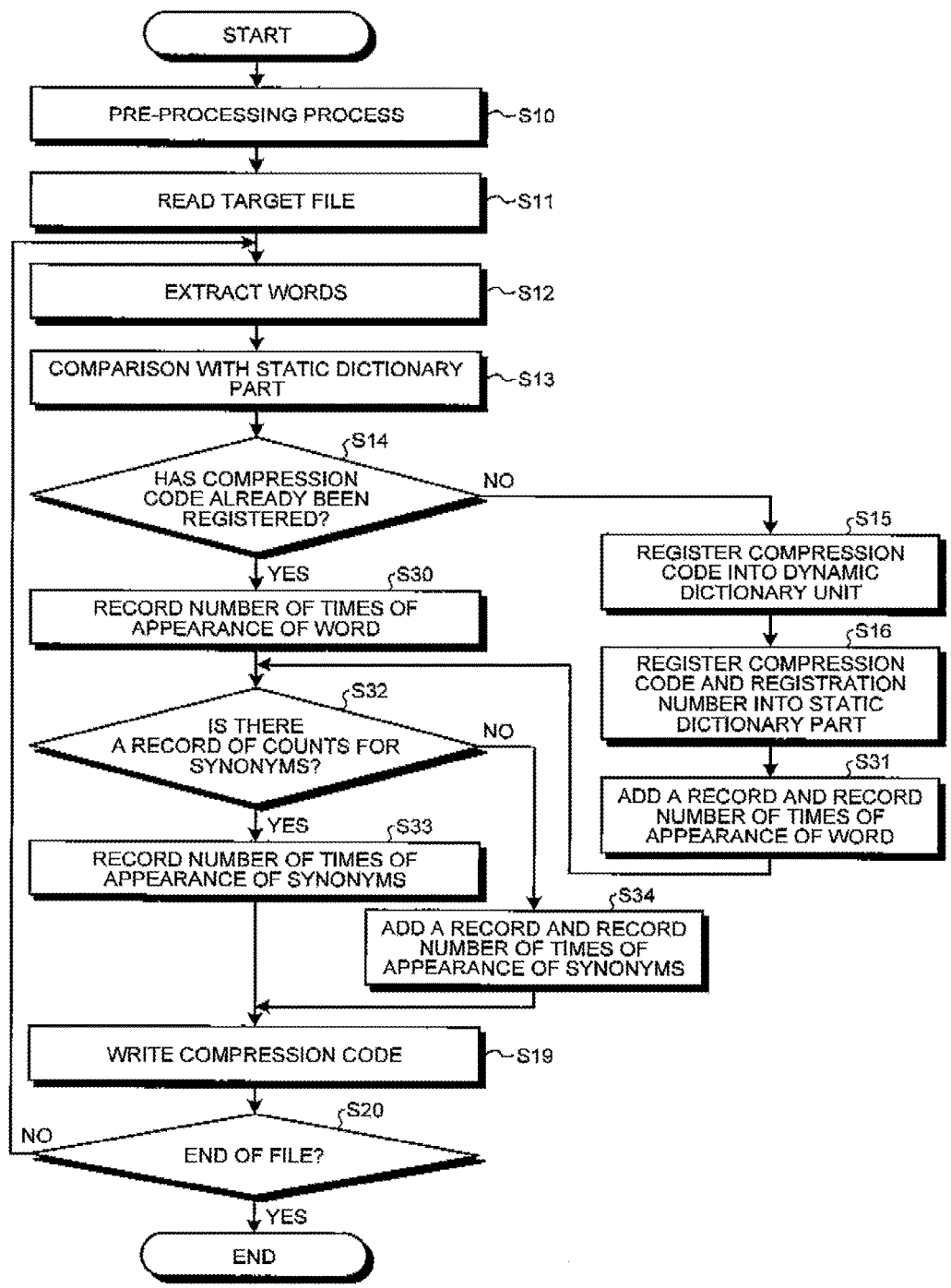
FIG. 15 is a flowchart of an exemplary flow in the index generating process according to the second embodiment.

Next, a flow in an index generating process according to the second embodiment will be explained, with reference to FIG. 15. FIG. 15 is a flowchart of an exemplary flow in the index generating process according to the second embodiment. Because the index generating process illustrated in FIG. 15 is partially the same as that illustrated in FIG. 8, differences will mainly be explained.

As illustrated by the example in FIG. 15, when the compressed code has already been registered in the record of the basic word (step S14: Yes), the storing unit 114 records the number of times of appearance of the word into the record corresponding to the registration number (i.e., either the static number or the dynamic number) of the extracted word (step S30). Subsequently, the storing unit 114 proceeds to the process at step S32.

In contrast, after step S16, the storing unit 114 adds a record with the dynamic number of the extracted word to the second storage region 125b of the word bitmap index 123 and records the number of times of appearance of the word, under the file number corresponding to the target file 10 (step S31). Subsequently, the storing unit 114 proceeds to the process at step S32.

The storing unit 114 judges whether or not the synonym number of the word extracted by the file reading unit 112 is registered in the third storage region 125c of the count map index 125 (step S32).

When the synonym number of the extracted word is registered (step S32: Yes), the storing unit 114 records the number of times of appearance of the synonyms under the file number corresponding to the target file 10, in the record identified with the synonym number of the extracted word (step S33). Subsequently, the storing unit 114 proceeds to the process at step S19.

On the contrary, when having determined that the synonym number of the extracted word is not registered (step S32: No), the storing unit 114 adds a record with the synonym number of the extracted word to the third storage region 125c. Further, the storing unit 114 records the number of times of appearance of the synonyms under the file number corresponding to the target file 10 (step S34). Subsequently, the storing unit 114 proceeds to the process at step S19.

Figure 16:
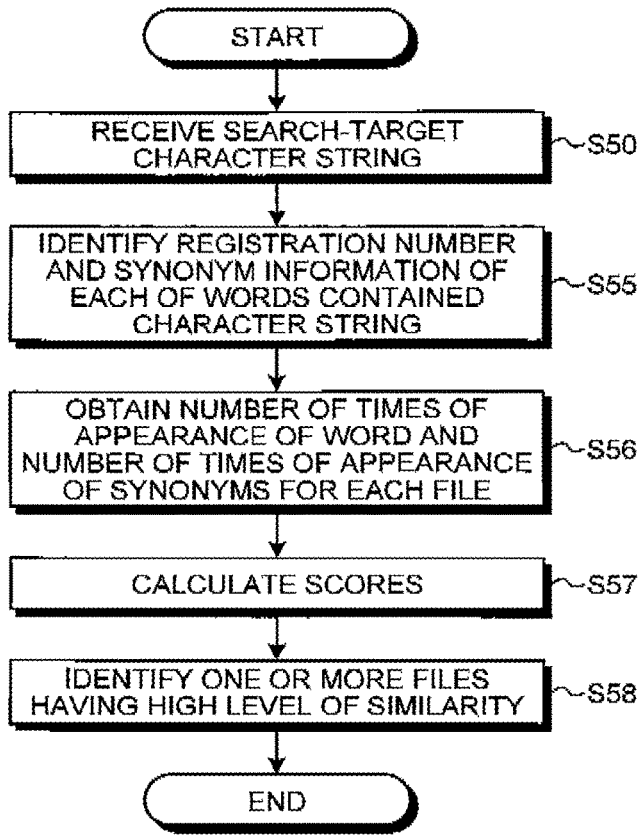
FIG. 16 is a flowchart of an exemplary flow in a searching process according to the second embodiment.

Next, a flow in a searching process according to the second embodiment will be explained, with reference to FIG. 16. FIG. 16 is a flowchart of an exemplary flow in the searching process according to the second embodiment. Because the searching process illustrated in FIG. 16 is partially the same as that illustrated in FIG. 9, differences will mainly be explained.

The obtaining unit 132 refers to the bit filter 121 and identifies the registration number and the synonym number of each of the words contained in the search-target character string (step S55). On the basis of the registration number and the synonym number, the obtaining unit 132 obtains the number of times of appearance of the word and the number of times of appearance of synonyms thereof in each of the compressed files, from the count map index 125 (step S56). For each of the files, the identifying unit 133 calculates a score by performing a weighted calculation on the number of times of appearance of the word and the number of times of appearance of the synonyms (step S57). The identifying unit 133 identifies one or more files each containing a character string having a high level of similarity to the search-target character string on the basis of the scores (step S58), and ends the process.

As explained above, the information processing apparatus 100 extracts the words from the compression-target file and assigns the codes to the words. The information processing apparatus 100 stores, for each of the words extracted from the compression-target file, the number of times of appearance of the word, into the storage unit 120 so as to be kept in correspondence with the information identifying the compression-target file. By generating the index corresponding to the words contained in the files in this manner, it is possible to reduce the volume of the index, compared to the situation where an index corresponding to all the words registered in a dictionary is generated. Further, when the search is conducted for the one or more files each having a high degree of relevance to the search-target character string, it is possible to shorten the searching time by obtaining the number of times of appearance of each of the words from the index.

Further, for each of the pieces of synonym information to which the word extracted from the compression-target file belongs, the information processing apparatus 100 stores the number of times the words corresponding to the synonym information have been extracted, into the storage unit 120 so as to be kept in correspondence with the other information identifying the compression-target file. With this arrangement, when the search is conducted for the one or more files each containing at least one of the synonyms of the search-target character string and having a high degree of relevance, the information processing apparatus 100 is able to shorten the searching time by obtaining the number of times of appearance of the synonyms of each of the words from the index.

Further, the information processing apparatus 100 identifies the synonym information to which each of the words belongs, by using the synonym database 124 that keeps the words and the pieces of synonym information in correspondence with one another. As a result, the information processing apparatus 100 is able to quickly identify the piece of synonym information to which each of the words belongs, from the synonym database 124.

Further, the information processing apparatus 100 obtains the number of times each of the words contained in the search-target character string has been extracted for each of the compression-target files, from the information identifying the compression-target file in which the number of times the word has been extracted is kept in correspondence for each of the words extracted from the compression-target file. The information processing apparatus 100 searches for the one or more compression-target files each having a high level of similarity to the search-target character string, on the basis of the number of times each of the words has been extracted that is obtained for each of the compression-target files. As a result, the information processing apparatus 100 is able to quickly search for the one or more compression-target files each having a high level of similarity to the search-target character string.

Further, the information processing apparatus 100 obtains the number of times each of the pieces of synonym information to which the words contained in the search-target character string belong has been extracted, from the other information that identifies the compression-target file in which the number of times the words corresponding to the synonym information have been extracted is kept in correspondence for each of the pieces of synonym information to which the words extracted from the compression-target file belong. The information processing apparatus 100 searches for the one or more compression-target files each having a high level of similarity to the search-target character string, on the basis of the number of times each of the words has been extracted and the number of times the synonym information has been extracted that is obtained for each of the compression-target files. As a result, the information processing apparatus 100 is able to quickly search for the one or more compression-target files each having a high level of similarity to the search-target character string, while taking the synonyms into consideration.

[c] Third Embodiment

The exemplary embodiments of the disclosed apparatus have thus been explained. It is, however, possible to embody the disclosed features in other various forms besides those in the embodiments described above. Thus, other exemplary embodiments of the present invention will be explained below.

For example, in the embodiments described above, the basic words are acquired from the population including the plurality of text files; however, possible embodiments are not limited to this example. It is acceptable to acquire the basic words from a single text file.

In the embodiments described above, the example is explained in which the 16-bit fixed-length compressed code is assigned to each of the lower frequency words; however, possible embodiments are not limited to this example. It is also acceptable to assign a number of bits other than sixteen bits to each of the lower frequency words.

In the embodiments described above, the variable-length code is assigned to each of the words in the 8,00th or higher places, whereas the fixed-length code is assigned to each of the words in the 8,001th or lower places; however, possible embodiments are not limited to this example. It is acceptable to assign variable-length codes and fixed-length codes to the words by using any other ranking place besides the 8,000th place as the boundary.

Further, besides the data in a file, the target of the compressing process may be a monitoring message output from a system, or the like. For example, a process may be performed to compress monitoring messages that are sequentially stored into a buffer by using the compressing process described above so that the compressed monitoring messages are stored as log files. Further, for example, the compressing process may be performed in units of pages in a database. Alternatively, the compressing process may be performed in units of groups each including multiple pages collectively.

In the embodiments described above, the index stores therein the information indicating whether each of the words appears or not or the number of times of appearance of each of the words, in units of files; however, possible embodiments are not limited to this example. For instance, the index may store therein the information indicating whether each of the words appears or not or the number of times of appearance of each of the words, in predetermined units, such as in units of chapters or paragraphs of the text in the file or in units of sectioned blocks each having a predetermined data size. The storing unit 114 may store therein the information indicating whether each of the words appears or not or the number of times of appearance of each of the words into the index in predetermined units into which the file is divided. Further, the obtaining unit 132 may obtain the number of times each of the words contained in the search-target character string has been extracted for each of the files, from the index storing therein the number of times of appearance of each of the words in such predetermined units.

It is possible to arbitrarily modify any of the processing procedures, the controlling procedures, the specific names, and the information including the various types of data and parameters described in the embodiments above, unless otherwise noted.

Further, the constituent elements of the apparatuses illustrated in the drawings are based on functional concepts. Thus, the constituent elements are not necessarily physically configured as illustrated in the diagram. In other words, the specific modes of distribution and integration of the apparatuses are not limited to the ones illustrated in the drawings. It is acceptable to functionally or physically distribute or integrate all or a part of the apparatuses in any arbitrary units, depending on various loads and the status of use. For example, any of the processing units such as the dictionary generating unit 111, the file reading unit 112, the registering unit 113, the storing unit 114, the file writing unit 115, the receiving unit 131, the obtaining unit 132, and the identifying unit 133 may be integrated together, as appropriate. Further, any of the processes performed by the processing units may be separated as processes performed by two or more of the processing units, as appropriate. Furthermore, all or an arbitrary part of the processing functions implemented by the processing units may be realized by a Central Processing Unit (CPU) and a computer program analyzed and executed by the CPU or may be realized as hardware using wired logic.

Figure 17:
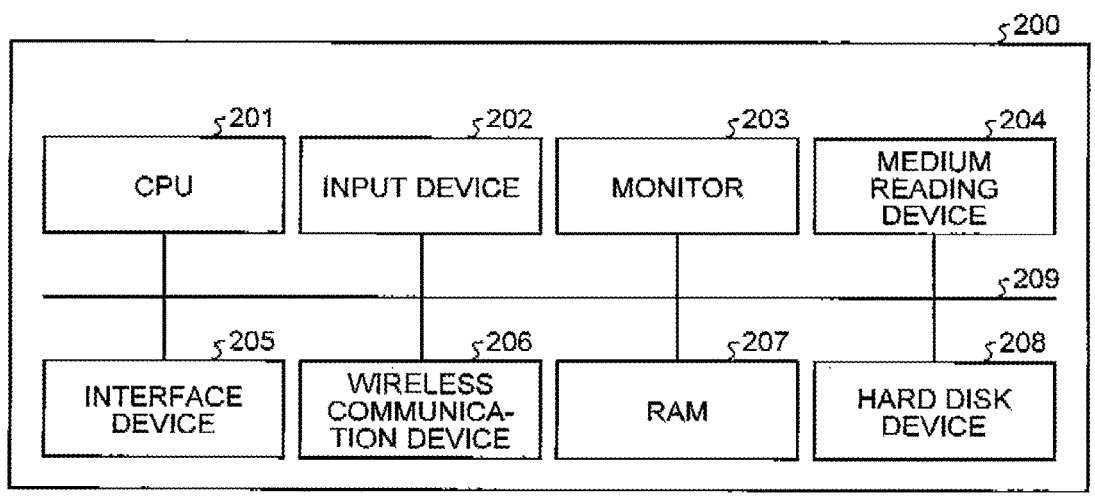
FIG. 17 is a diagram of a hardware configuration of an information processing apparatus.

FIG. 17 is a diagram of a hardware configuration of an information processing apparatus. As illustrated in FIG. 17, a computer 200 includes a CPU 201 that performs various types of computing processes; an input device 202 that receives a data input from a user; and a monitor 203. Further, the computer 200 includes a medium reading device 204 that reads a computer program and the like from a storage medium, an interface device 205 that establishes a connection to another apparatus, and a wireless communication device 206 that establishes a wireless connection to another apparatus. Further, the computer 200 includes a Random Access Memory (RAM) 207 that temporarily stores therein various types of information and a hard disk device 208. Further, the devices 201 to 208 are connected to a bus 209.

The hard disk device 208 stores therein, for example, an information processing computer program (hereinafter, "information processing program") that has the same functions as the functions of the processing units such as the dictionary generating unit 111, the file reading unit 112, the registering unit 113, the storing unit 114, and the file writing unit 115 included in the compressing unit 110. Further, the hard disk device 208 stores therein, for example, an information processing program that has the same functions as the functions of the processing units such as the receiving unit 131, the obtaining unit 132, and the identifying unit 133 included in the searching unit 130 illustrated in FIGS. 4 and 11. Further, the hard disk device 208 stores therein various types of data for realizing the information processing programs.

The CPU 201 performs the various types of process by reading the programs stored in the hard disk device 208, loading the read programs into the RAM 207, and executing the programs. These programs are capable of causing the computer 200 to function as, for example, the dictionary generating unit 111, the file reading unit 112, the registering unit 113, the storing unit 114, and the file writing unit 115. Further, these programs are capable of causing the computer 200 to function as the receiving unit 131, the obtaining unit 132, and the identifying unit 133.

The information processing programs described above do not necessarily have to be stored in the hard disk device 208. For example, the programs may be stored in a storage medium that is readable by the computer 200 so as to be read and executed by the computer 200. The storage medium that is readable by the computer 200 corresponds to, for example, a portable recording medium such as a Compact Disk Read-Only Memory (CD-ROM), a Digital Versatile Disk (DVD), or a Universal Serial Bus (USB) memory, a semiconductor memory such as a flash memory, a hard disk drive, or the like. Alternatively, it is also acceptable to have the programs stored in a device connected to a public line, the Internet, a Local Area Network (LAN), or the like, so that the computer 200 reads and executes these programs therefrom.

According to at least one aspect of the embodiments of the present invention, an advantageous effect is achieved where it is possible to inhibit the occurrence of search noise, while keeping the data size of the index small.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a compression program that causes a computer to execute a process comprising:

extracting a specific word from a target file;

storing appearance information of the extracted word in correspondence with a specific record of the specific word in an index data that denotes an information bit string indicating files containing words, when the specific word is stored in a static dictionary that stores a plurality of words and a plurality of compressed codes corresponding respectively to the plurality of words, the appearance information including existence information indicating whether the specific word exists in the target file or appearance information indicating how many times the specific word has appeared in the target file, the index data including the plurality of words in the static dictionary and code words corresponding to the plurality of words, each code word having a length that is inversely proportional to a frequency of appearance of a corresponding one of the plurality of words; and adding a specific record of the specific word to the index data and storing appearance information of the extracted word in correspondence with the specific record of the specific word in the index data, when the specific word is not stored in the static dictionary and stored in a dynamic dictionary whose records are added in a course of compression, the appearance information including existence information indicating whether the specific word exists in the target file or appearance information indicating how many times the specific word has appeared in the target file.

2. The non-transitory computer-readable recording medium according to claim 1, wherein the storing stores, into the index data, either the appearance information indicating whether the specific word exists in the target file or the appearance information indicating how many times the specific word has appeared, either in units of files or in predetermined units into which each file is divided.

3. The non-transitory computer-readable recording medium according to claim 1, the process further comprising storing into the index data, for each of pieces of synonym information to which the specific word extracted from the target file belongs, information indicating how many times words corresponding to the piece of synonym information have been extracted.

4. The non-transitory computer-readable recording medium according to claim 3, the process further comprising identifying the pieces of synonym information to which the specific word extracted from the target file belongs, by using a synonym database in which words and pieces of synonym information are kept in correspondence with one another, wherein the storing of the information into the index data stores, for each of the identified pieces of synonym information, the information indicating how many times the words corresponding to the piece of synonym information have been extracted.

5. A non-transitory computer-readable recording medium having stored therein a search program that causes a computer to execute a process comprising:

obtaining, for each of a plurality of compressed files, information indicating how many times a word contained in a search-target character string has been extracted, from an index data, that denotes an information string indicating files containing words, storing therein information indicating how many times each word has appeared either in a specific unit of the plurality of compressed files or in predetermined units into which each file is divided, the index data including the plurality of words in a static dictionary and a dynamic dictionary and code words corresponding to the plurality of words, the static dictionary and the dynamic dictionary being used for compressing the plurality of compressed files, each code word having a length that is inversely proportional to a frequency of appearance of a corresponding one of the plurality of words; and searching for one or more files each having a high level of similarity to the search-target character string, on a basis of the information that indicates how many times the word has been extracted and that is obtained for each of the files.

6. The non-transitory computer-readable recording medium according to claim 5, wherein the index data stores therein, for each of pieces of synonym information to which the word belongs, information indicating how many times words corresponding to the piece of synonym information have been extracted, the obtaining obtains, from the index data, information indicating how many times the piece of synonym information to which the word contained in the search-target character string belongs has been extracted, and the searching searches for the one or more files each having the high level of similarity to the search-target character string, on a basis of the information indicating, for each of the files, how many times the word has been extracted and the information indicating how many times the piece of synonym information has been extracted.

7. The non-transitory computer-readable recording medium according to claim 1, wherein the plurality of words in the static dictionary have a higher frequency of appearance than other words, and the index data is stored in a first storage region of the index data corresponding to the static dictionary or a second storage region of the index data corresponding to the dynamic dictionary.

8. The non-transitory computer-readable recording medium according to claim 5, wherein the plurality of words in the static dictionary have a higher frequency of appearance than other words, and the index data is stored in a first storage region of the index data corresponding to the static dictionary or a second storage region of the index data corresponding to the dynamic dictionary.

* * * * *